US008452912B2

United States Patent
Lee et al.

(10) Patent No.: US 8,452,912 B2
(45) Date of Patent: May 28, 2013

(54) FLASH-MEMORY SYSTEM WITH ENHANCED SMART-STORAGE SWITCH AND PACKED META-DATA CACHE FOR MITIGATING WRITE AMPLIFICATION BY DELAYING AND MERGING WRITES UNTIL A HOST READ

(75) Inventors: Charles C. Lee, Cupertino, CA (US); Frank Yu, Palo Alto, CA (US); Abraham C. Ma, Fremont, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 902 days.

(21) Appl. No.: 12/576,216

(22) Filed: Oct. 8, 2009

(65) Prior Publication Data

US 2010/0023682 A1 Jan. 28, 2010

Related U.S. Application Data

(63) Continuation-in-part of application No. 12/254,428, filed on Oct. 20, 2008, now Pat. No. 7,849,242, and a continuation-in-part of application No. 12/128,916, filed on May 29, 2008, now Pat. No. 7,552,251, and a continuation-in-part of application No. 12/252,155, filed on Oct. 15, 2008, now Pat. No. 8,037,234, and a continuation-in-part of application No. 12/418,550, filed on Apr. 3, 2009, now abandoned, and a continuation-in-part of application No. 11/871,011, filed on Oct. 11, 2007, now Pat. No. 7,934,074, and a continuation-in-part of application No. 12/347,306, filed on Dec. 31, 2008, now Pat. No. 8,112,574, and a continuation-in-part of application No. 11/926,636, filed on Oct. 29, 2007, now Pat. No. 7,657,692, and a continuation-in-part of application No. 11/926,743, filed on Oct. 29, 2007, now Pat. No. 8,078,794, and a continuation-in-part of application No. 11/871,627, filed on Oct. 12, 2007, now Pat. No. 7,966,462.

(51) Int. Cl.
*G06F 12/00* (2006.01)

(52) U.S. Cl.
USPC ........... 711/103; 711/143; 711/156; 714/766; 710/54

(58) Field of Classification Search
USPC .............. 711/103, 156, 143; 714/766; 710/54
See application file for complete search history.

(56) References Cited

U.S. PATENT DOCUMENTS 5,905,993 A 5/1999 Shinohara
6,289,416 B1 * 9/2001 Fukushima et al. .......... 711/113
(Continued)

*Primary Examiner* — Kalpit Parikh
(74) *Attorney, Agent, or Firm* — Stuart T. Auvinen; gPatent LLC

(57) ABSTRACT

A flash memory solid-state-drive (SSD) has a smart storage switch that reduces write acceleration that occurs when more data is written to flash memory than is received from the host. Page mapping rather than block mapping reduces write acceleration. Host commands are loaded into a Logical-Block-Address (LBA) range FIFO. Entries are sub-divided and portions invalidated when a new command overlaps an older command in the FIFO. Host data is aligned to page boundaries with pre- and post-fetched data filling in to the boundaries. Repeated data patterns are detected and encoded by compressed meta-data codes that are stored in meta-pattern entries in a meta-pattern cache of a meta-pattern flash block. The sector data is not written to flash. The meta-pattern entries are located using a meta-data mapping table. Storing host CRC's for comparison to incoming host data can detect identical data writes that can be skipped, avoiding a write to flash.

21 Claims, 31 Drawing Sheets

U.S. PATENT DOCUMENTS

| | | |
|---|---|---|
| 6,721,843 B1 | 4/2004 | Estakhri |
| 6,772,274 B1 | 8/2004 | Estakhri |
| 7,073,010 B2 | 7/2006 | Chen et al. |
| 7,194,596 B2 | 3/2007 | Wu et al. |
| 7,263,591 B2 | 8/2007 | Estakhri et al. |
| 2007/0083697 A1 | 4/2007 | Birrell et al. |
| 2008/0028131 A1 | 1/2008 | Kudo et al. |
| 2008/0028165 A1 | 1/2008 | Sukegawa |
| 2008/0155160 A1 | 6/2008 | McDaniel |
| 2008/0155177 A1 | 6/2008 | Sinclair et al. |
| 2008/0155182 A1 | 6/2008 | Kudo |
| 2008/0162792 A1 | 7/2008 | Wu et al. |
| 2008/0162793 A1 | 7/2008 | Chu et al. |
| 2008/0189490 A1 | 8/2008 | Cheon et al. |
| 2009/0172257 A1 * | 7/2009 | Prins et al. .................... 711/103 |

* cited by examiner

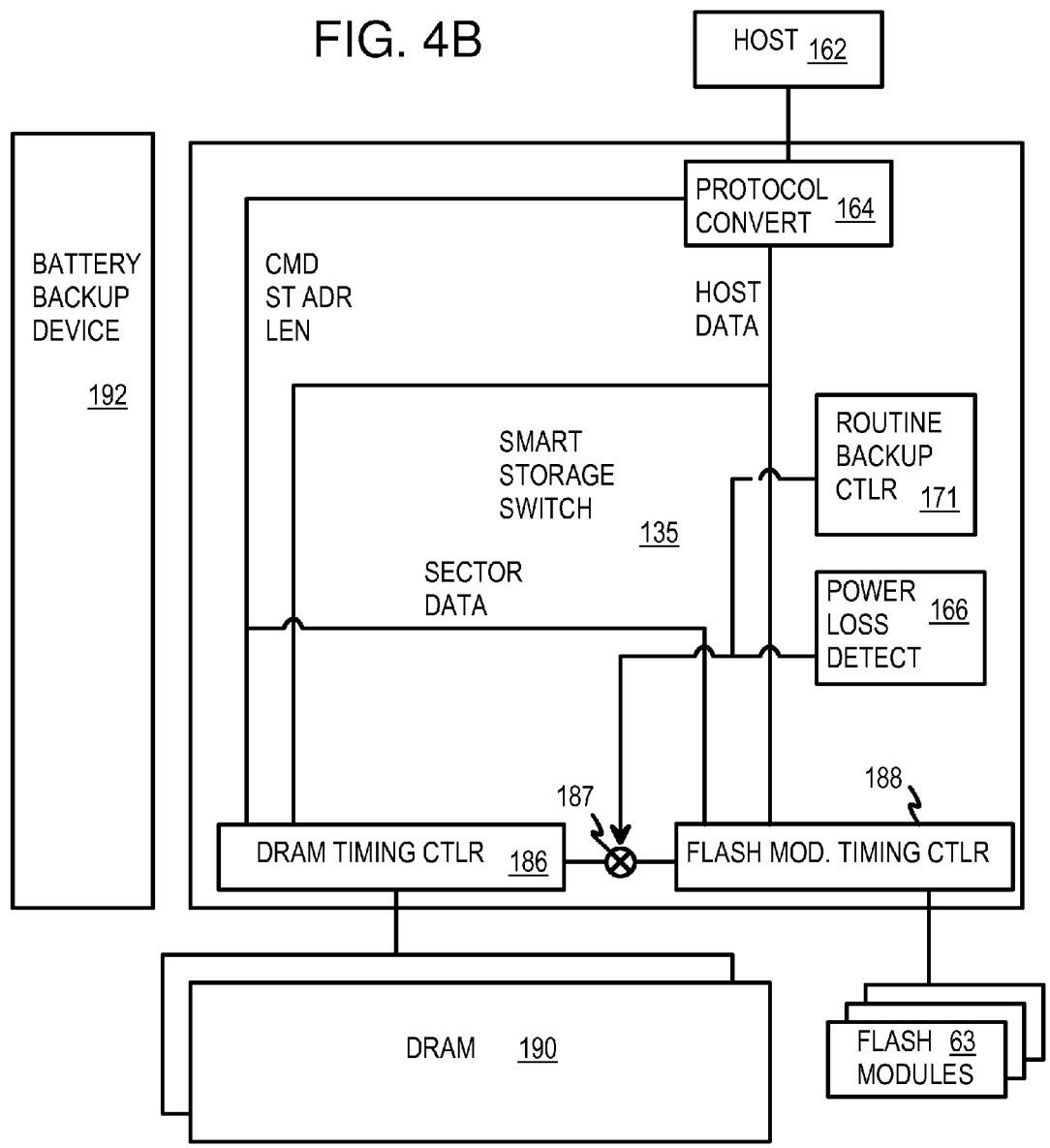

BLOCK MAPPING

PAGE MAPPING

| SEQ # | START LBA | LEN | CMD |
|---|---|---|---|
| W1 | 100 | 5 | W |
| W2 | 103 | 4 | W |
| W3 | 96 | 5 | W |
| R4 | 98 | 5 | R |
FIG. 7A
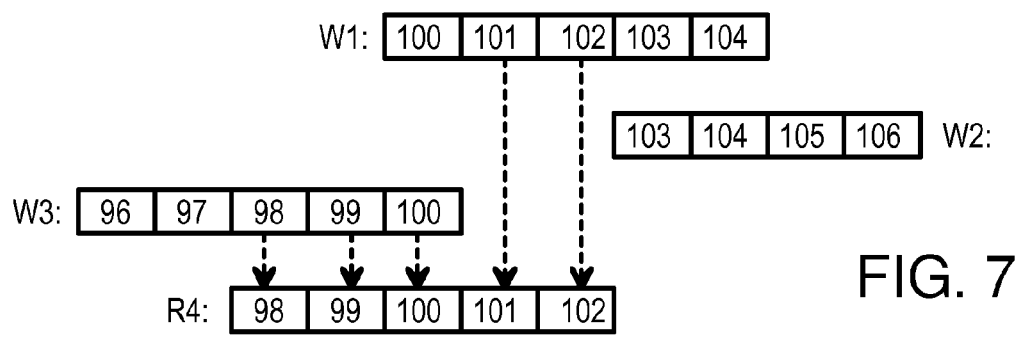
FIG. 7B
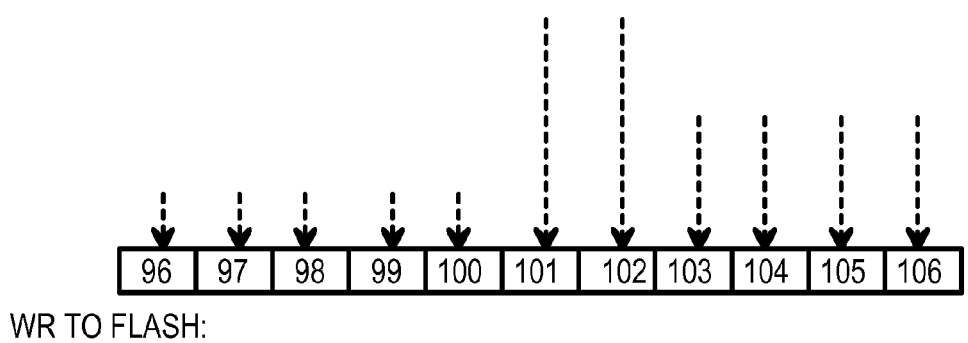
FIG. 7C
DELAY WRITE TO FLASH UNTIL A HOST READ OCCURS

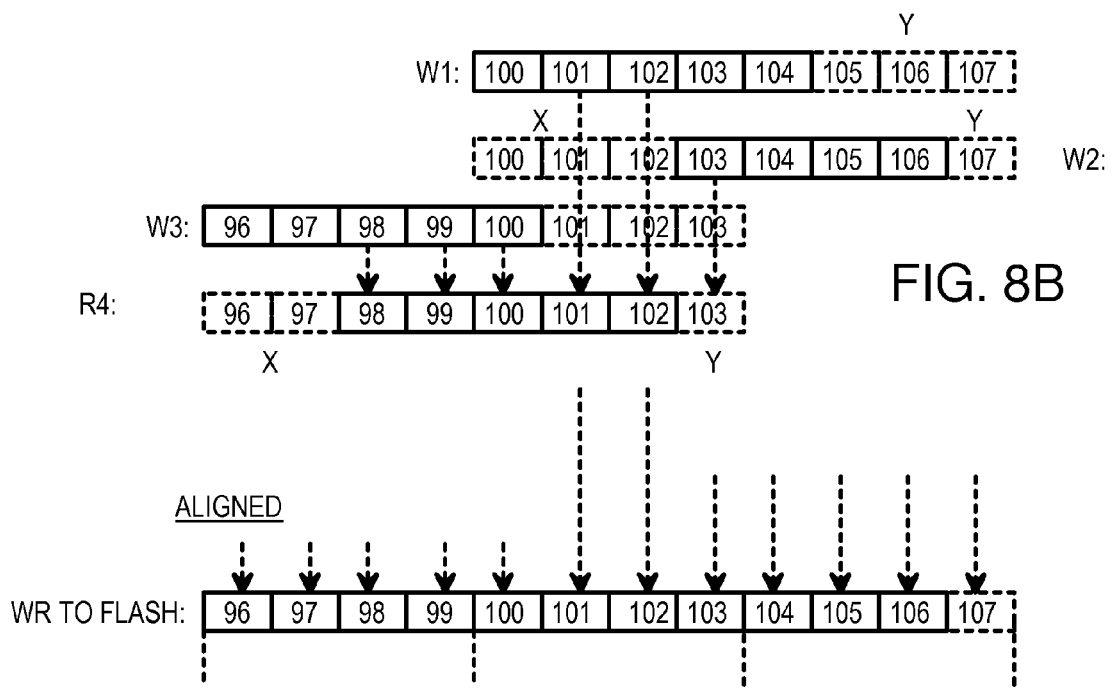
DELAY WRITE TO FLASH UNTIL A HOST READ OCCURS

| SEQ # | START LBA | LEN | CMD |
|---|---|---|---|
| W1 | 3 | 12 | W |
| W2 | 5 | 8 | W |
| W3 | 2 | 5 | W |
| W4 | 1 | 5 | W |
| R5 | 3 | 7 | R |
FIG. 10A
SECTOR DATA BUFFER
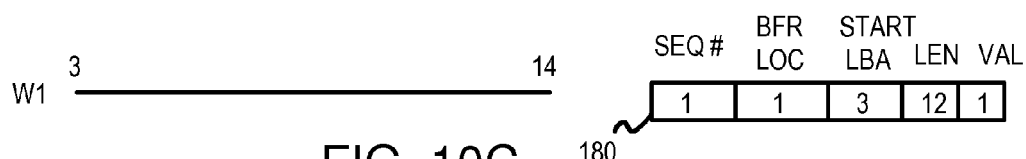
FIG. 10B
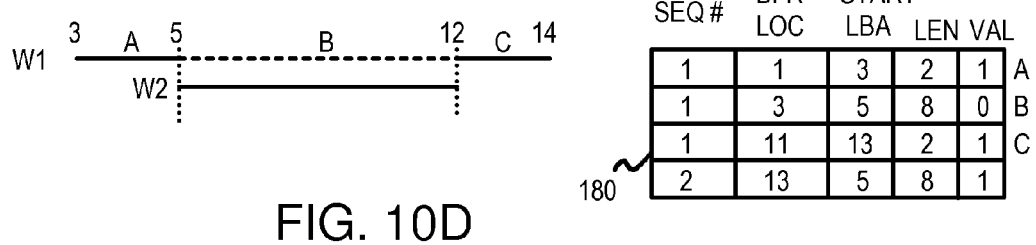
FIG. 10C
FIG. 10D

SECTOR DATA:  M-CODE:

FFFF FFFF FFFF FFFF ... FFFF

FFF 0000 0000 0000 0000 ... 0000

F00

1010 1010 1010 1010 ... 1010

FAA 0101 0101 0101 0101 ... 0101

F55

FIRST BYTE REPEATED = FXX

A5A5 A5A5 A5A5 A5A5 ... A5A5

FA5

FIRST 2 BYTES REPEATED = EXXXX

FF01 FF01 FF01 FF01 ... FF01

EFF01

FIG. 13

CACHE CRC'S IN SDRAM CACHE

| | 4KB | | 4B | | 32B | |
|---|---|---|---|---|---|---|
| | SECTOR DATA | CRC | CRC | CRC | ... | CRC |
| | SECTOR DATA | CRC | CRC | CRC | | CRC |
| 4K ADDRESSES | SECTOR DATA | CRC | CRC | CRC | | CRC |
| | ⋮ | ⋮ | | | | ⋮ |
| | SECTOR DATA | CRC | CRC | CRC | ... | CRC |

128 KB OF CRC'S IN SDRAM

STORE ALL CRC'S IN SDRAM CACHE & FLASH MEM

128 MB OF CRC'S IN SDRAM

FLASH-MEMORY SYSTEM WITH ENHANCED SMART-STORAGE SWITCH AND PACKED META-DATA CACHE FOR MITIGATING WRITE AMPLIFICATION BY DELAYING AND MERGING WRITES UNTIL A HOST READ

RELATED APPLICATION

This application is a continuation-in-part of the co-pending application for "Command Queuing Smart Storage Transfer Manager for Striping Data to Raw-NAND Flash Modules", Ser. No. 12/252,155, filed Oct. 15, 2008.

This application is a continuation-in-part (CIP) of U.S. patent application for "Single-Chip Multi-Media Card/Secure Digital controller Reading Power-on Boot Code from Integrated Flash Memory for User Storage", Ser. No. 12/128,916, filed on May 29, 2008 now U.S. Pat. No. 7,552,251.

This application is a continuation-in-part (CIP) of "Hybrid 2-Level Mapping Tables for Hybrid Block- and Page-Mode Flash-Memory System", U.S. Ser. No. 12/418,550, filed Apr. 3, 2009.

This application is also a CIP of co-pending U.S. patent application for "Swappable Sets of Partial-Mapping Tables in a Flash-Memory System With A Command Queue for Combining Flash Writes", U.S. application Ser. No. 12/347,306, filed Dec. 31, 2008.

This application is also a CIP of co-pending U.S. patent application for "PCI Express-Compatible controller and Interface for Flash Memory", U.S. application Ser. No. 12/254,428, filed Oct. 20, 2008 which is also a CIP of "High level bridge from PCIE to Extended USB", U.S. application Ser. No. 11/926,636, filed Oct. 29, 2007.

This application is also a CIP of co-pending U.S. patent application for "Hybrid SSD Using a Combination of SLC and MLC Flash Memory Arrays", U.S. application Ser. No. 11/926,743, filed Oct. 29, 2007.

This application is also a CIP of co-pending U.S. patent application for "Flash Module with Plane-Interleaved Sequential Writes to Restricted-Write Flash Chips", U.S. application Ser. No. 11/871,011, filed Oct. 11, 2007 and "Multi-Channel Flash Module with Plane-Interleaved Sequential ECC Writes and Background Recycling to Restricted-Write Flash Chips", U.S. application Ser. No. 11/871,627, filed Oct. 12, 2007.

This application is related to U.S. patent application for "Single-Chip Multi-media Card/Secure Digital Controller Reading Power-on Boot Code from Integrated Flash Memory for User Storage", Ser. No. 11/309,594, filed on Aug. 28, 2006, now issued as U.S. Pat. No. 7,383,362, which is a CIP of U.S. patent application for "Single-Chip USB Controller Reading Power-On Boot Code from Integrated Flash Memory for User Storage", Ser. No. 10/707,277, filed on Dec. 2, 2003, now issued as U.S. Pat. No. 7,103,684. Also related to U.S. patent application for "USB Smart Switch with Packet Re-Ordering for inter-leaving Among Multiple Flash-Memory Endpoints Aggregated as a Single Virtual USB Endpoint", U.S. Ser. No. 10/707,276, filed on Dec. 2, 2003 now issued as U.S. Pat. No. 7,073,010.

FIELD OF THE INVENTION

This invention relates to flash-memory solid-state-drive (SSD) devices, and more particularly to reduction of write amplification to flash memory.

BACKGROUND OF THE INVENTION

Systems such as Personal Computers (PC's) store large amounts of data in mass-storage devices such as hard disk drives (HDD). Mass-storage devices are sector-addressable rather than byte-addressable, since the smallest unit of flash memory that can be read or written is a page that is several 512-byte sectors in size. Flash memory is replacing hard disks and optical disks as the preferred mass-storage medium.

NAND flash memory is a type of flash memory constructed from electrically-erasable programmable read-only memory (EEPROM) cells, which have floating gate transistors. These cells use quantum-mechanical tunnel injection for writing and tunnel release for erasing. NAND flash is non-volatile so it is ideal for portable devices storing data. NAND flash tends to be denser and less expensive than NOR flash memory.

However, NAND flash has limitations. In the flash memory cells, the data is stored in binary terms—as ones (1) and zeros (0). One limitation of NAND flash is that when storing data (writing to flash), the flash can only write from ones (1) to zeros (0). When writing from zeros (0) to ones (1), the flash needs to be erased a "block" at a time. Although the smallest unit for read can be a byte or a word within a page, the smallest unit for erase is a block.

Single Level Cell (SLC) flash and Multi Level Cell (MLC) flash are two types of NAND flash. The erase block size of SLC flash may be 128K+4K bytes while the erase block size of MLC flash may be 256K+8K bytes. Another limitation is that NAND flash memory has a finite number of erase cycles between 10,000 and 100,000, after which the flash wears out and becomes unreliable.

Comparing MLC flash with SLC flash, MLC flash memory has advantages and disadvantages in consumer applications. In the cell technology, SLC flash stores a single bit of data per cell, whereas MLC flash stores two or more bits of data per cell. MLC flash can have twice or more the density of SLC flash with the same technology. But the performance, reliability and durability may decrease for MLC flash.

MLC flash has a higher storage density and is thus better for storing long sequences of data; yet the reliability of MLC is less than that of SLC flash. Data that is changed more frequently is better stored in SLC flash, since SLC is more reliable and rapidly-changing data is more likely to be critical data than slowly changing data. Also, smaller units of data may more easily be aggregated together into SLC than MLC, since SLC often has fewer restrictions on write sequences than does MLC.

One problem that the inventors have noticed with MLC flash systems is write amplification. The number of writes to flash may actually be larger than the number of writes from the host. This is especially true of MLC flash systems that have restrictions on the sequential page writes and single partial write to flash memory. These restrictions may cause additional flash writes that would not be necessary if less restrictive SLC flash memory were used.

For example, a host may over-write 4 pages of data. The four pages of data may be stored in a cache used by the flash drive system that is caching an entire block of pages. Updating the four pages may cause the entire block of 128 pages to be written back to flash memory. Thus a write amplification of 128/4 or 32× occurs, since the 4 pages of host data caused 128 pages to be written to the flash memory.

What is desired is a flash memory system that has mechanisms for reducing write amplification. A flash memory solid-state drive (SSD) with a controller that reduces write amplification is desirable. Using meta-data and command and sector data merging is desirable to reduce write amplification. Also contemporary SSD with PCI-Express interface cannot be directly booted from the current OS kernel without a customized driver, so a proposed method for booting is also described.

BRIEF DESCRIPTION OF THE DRAWINGS

FIG. 4B is a block diagram of a simplified smart storage switch.

FIGS. 7A-C show delaying writes to flash until a host read occurs.

FIGS. 8A-C highlight data alignment when writing to flash memory.

FIGS. 10A-G show an example of operation of the LBA range FIFO.

FIG. 13 highlights meta-data for matched patterns of sector data.

DETAILED DESCRIPTION

The present invention relates to an improvement in flash memory write amplification. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1A:
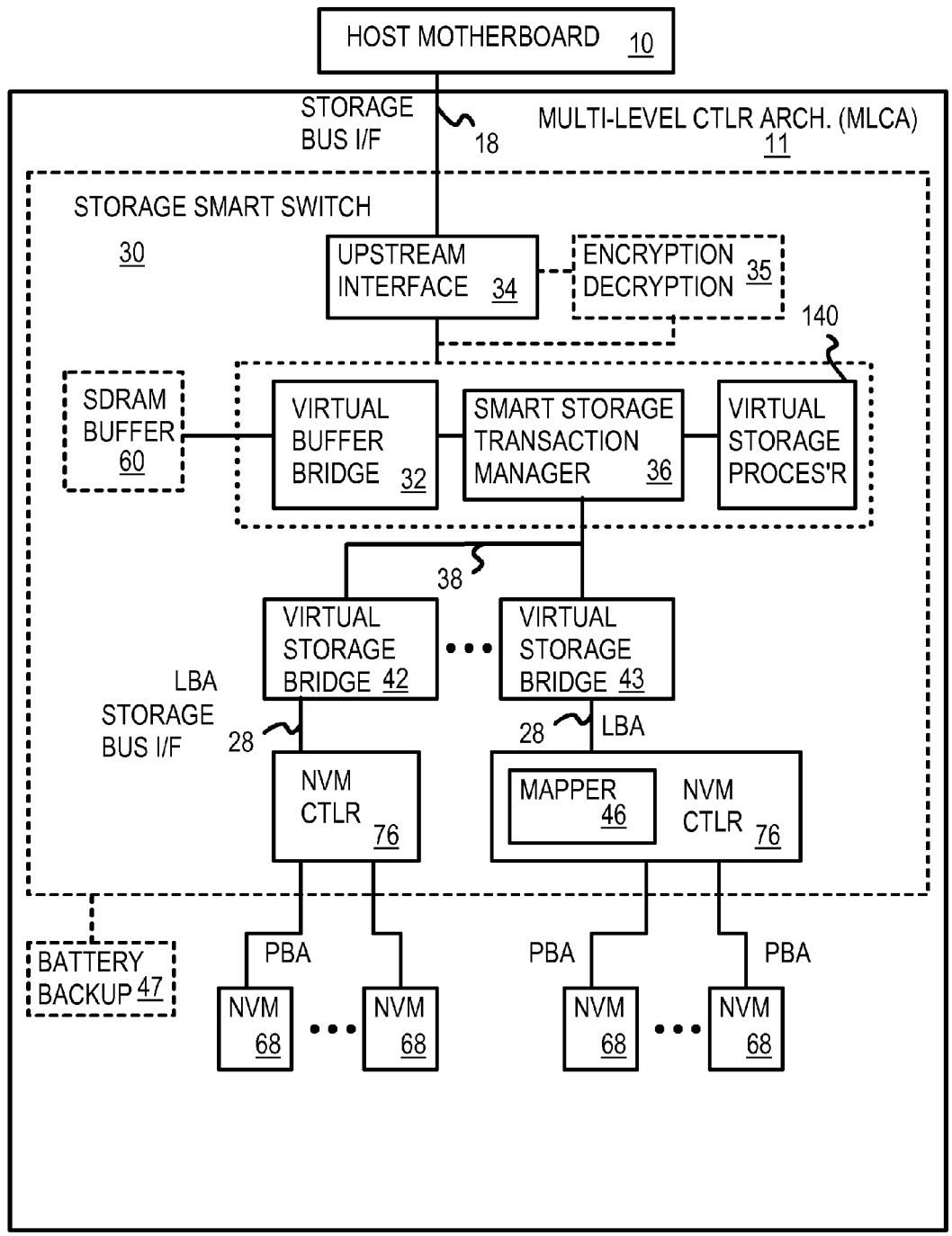
FIG. 1A shows a smart storage switch using hybrid flash memory with multiple levels of integrated controllers.

FIG. 1A shows a smart storage switch using hybrid flash memory with multiple levels of integrated controllers. Smart storage switch 30 is part of multi-level controller architecture (MLCA) 11 and connects to host motherboard 10 over host storage bus 18 through upstream interface 34. Smart storage switch 30 also connects to downstream flash storage device over LBA storage bus interface 28 through virtual storage bridges 42, 43.

Virtual storage bridges 42, 43 are protocol bridges that also provide physical signaling, such as driving and receiving differential signals on any differential data lines of LBA storage bus interface 28, detecting or generating packet start or stop patterns, checking or generating checksums, and higher-level functions such as inserting or extracting device addresses and packet types and commands. The host address from host motherboard 10 contains a logical block address (LBA) that is sent over LBA storage bus interface 28, although this LBA may be stripped by smart storage switch 30 in some embodiments that perform ordering and distributing equal sized data to attached NVM flash memory 68 through NVM controller 76. NVM flash memory 68 can be NAND, ONFI NAND, Toggle NAND, NOR, flash memories, DRAM with battery, etc. or a combination thereof.

Buffers in SDRAM 60 coupled to virtual buffer bridge 32 can store the sector data when the host writes data to a MLCA disk, and temporally hold data while the host is fetching from flash memories. SDRAM 60 is a synchronous dynamic-random-access memory for smart storage switch 30. SDRAM 60 also can be used as temporary data storage or a cache for performing Write-Back, Write-Thru, or Read-Ahead Caching.

Virtual storage processor 140 provides striping services to smart storage transaction manager 36. For example, logical addresses from the host can be calculated and translated into logical block addresses (LBA) that are sent over LBA storage bus interface 28 to NVM flash memory 68 controlled by NVM controllers 76. Host data may be alternately assigned to flash memory in an interleaved fashion by virtual storage processor 140 or by smart storage transaction manager 36. NVM controller 76 may then perform a lower-level interleaving among NVM flash memory 68. Thus interleaving may be performed on two levels, both at a higher level by smart storage transaction manager 36 among two or more NVM controllers 76, and by each NVM controller 76 among NVM flash memory 68.

NVM controller 76 performs logical-to-physical remapping as part of a flash translation layer function, which converts LBA's received on LBA storage bus interface 28 to PBA's that address actual non-volatile memory blocks in NVM flash memory 68. NVM controller 76 may perform wear-leveling and bad-block remapping and other management functions at a lower level.

When operating in single-endpoint mode, smart storage transaction manager 36 not only buffers data using virtual buffer bridge 32, but can also re-order packets for transactions from the host. A transaction may have several packets, such as an initial command packet to start a memory read, a data packet from the memory device back to the host, and a handshake packet to end the transaction. Rather than have all packets for a first transaction complete before the next transaction begins, packets for the next transaction can be re-ordered by smart storage switch 30 and sent to NVM controller 76 before completion of the first transaction. This allows more time for memory access to occur for the next transaction. Transactions are thus overlapped by re-ordering packets.

Packets sent over LBA storage bus interface 28 are re-ordered relative to the packet order on host storage bus 18. Transaction manager 36 may overlap and interleave transactions to different NVM flash memory 68 controlled by NVM controllers 76, allowing for improved data throughput. For example, packets for several incoming host transactions are stored in SDRAM buffer 60 via virtual buffer bridge 32 or an associated buffer (not shown). Transaction manager 36 examines these buffered transactions and packets and re-orders the packets before sending them over internal bus 38 to virtual storage bridge 42, 43, then to one of the downstream flash storage blocks via NVM controllers 76.

A packet to begin a memory read of a flash block through bridge 43 may be re-ordered ahead of a packet ending a read of another flash block through bridge 42 to allow access to begin earlier for the second flash block.

Encryption and decryption of data may be performed by encryptor/decryptor 35 for data passing over host storage bus 18. Upstream interface 34 may be configured to divert data streams through encryptor/decryptor 35, which can be controlled by a software or hardware switch to enable or disable the function. This function can be an Advanced Encryption Standard (AES), IEEE 1667 standard, etc, which will authenticate the transient storage devices with the host system either through hardware or software programming. The methodology can be referenced to U.S. application Ser. No. 11/924, 448, filed Oct. 25, 2007. Battery backup 47 can provide power to smart storage switch 30 when the primary power fails, allowing write data to be stored into flash. Thus a write-back caching scheme may be used with battery backup 47 rather than only a write-through scheme.

Mapper 46 in NVM controller 76 performs one level of mapping to NVM flash memory 68 that are MLC flash, or two levels of mapping to NVM flash memory 68 that are SLC or MLC flash. NVM controller 76 is embedded with storage smart switch 30. Smart storage switch 30 can be soldered to the board for MLCA 11. MLCA 11 can be an internal or an external device.

Figure 1B:
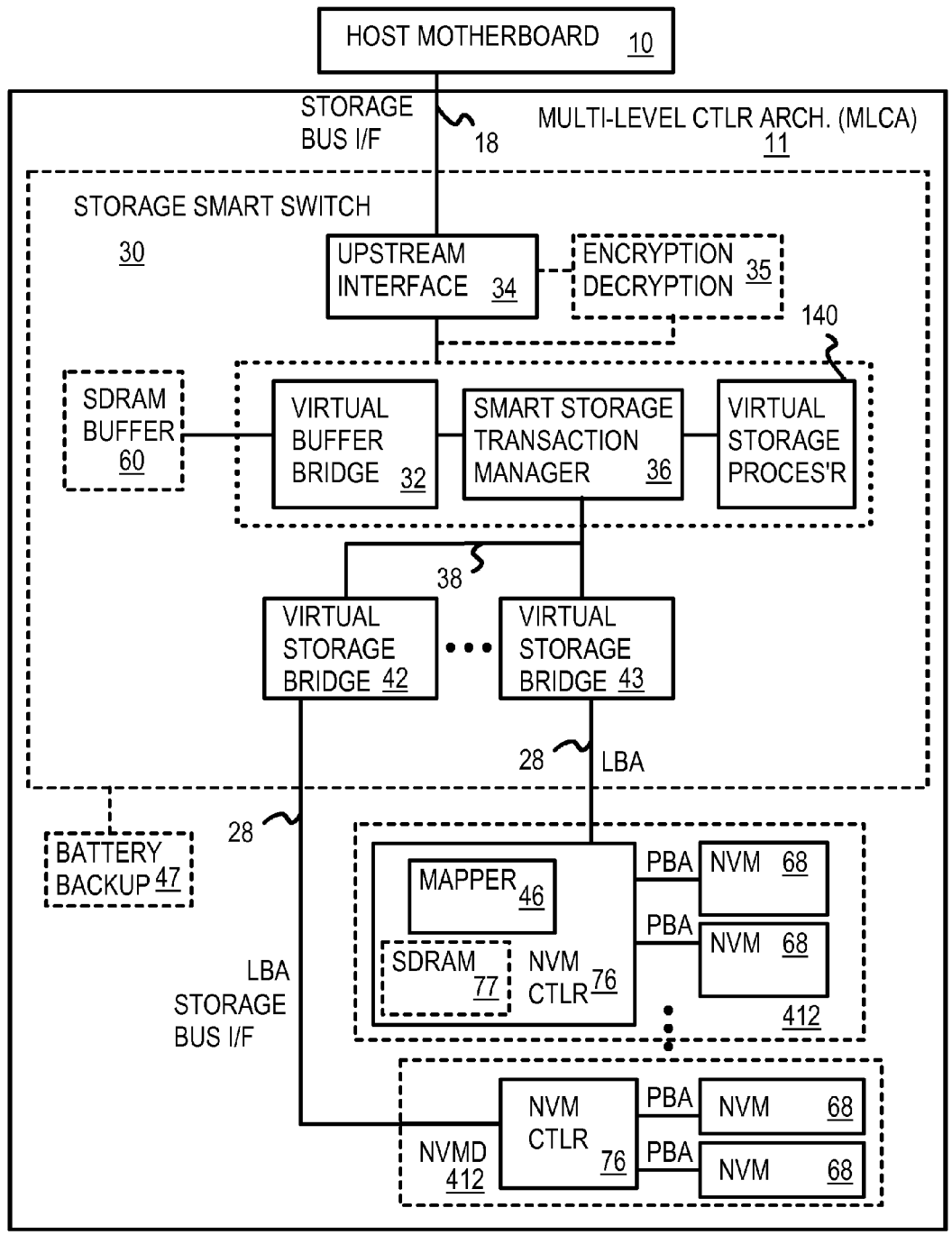
FIG. 1B shows a smart storage switch using hybrid flash memory with multiple levels of controllers and external NVMD.

FIG. 1B shows a smart storage switch using hybrid flash memory with multiple levels of controllers and external NVMD. Smart storage switch 30 is part of multi-level controller architecture (MLCA) 11 and connects to host motherboard 10 over host storage bus 18 through upstream interface 34. Smart storage switch 30 also connects to downstream flash storage device over LBA storage bus interface 28 through virtual storage bridges 42, 43.

Virtual storage bridges 42, 43 are protocol bridges that also provide physical signaling, such as driving and receiving differential signals on any differential data lines of LBA storage bus interface 28, detecting or generating packet start or stop patterns, checking or generating checksums, and higher-level functions such as inserting or extracting device addresses and packet types and commands. The host address from host motherboard 10 contains a logical block address (LBA) that is sent over LBA storage bus interface 28, although this LBA may be stripped by smart storage switch 30 in some embodiments that perform ordering and distributing equal sized data to attached NVM flash memory 68 through NVM controller 76.

Buffers in SDRAM 60 coupled to virtual buffer bridge 32 can store the sector data when the host writes data to a MLCA disk, and temporally hold data while the host is fetching from flash memories. SDRAM 60 is a synchronous dynamic-random-access memory for smart storage switch 30. SDRAM 60 also can be used as temporary data storage or a cache for performing Write-Back, Write-Thru, or Read-Ahead Caching.

Virtual storage processor 140 provides striping services to smart storage transaction manager 36. For example, logical addresses from the host can be calculated and translated into logical block addresses (LBA) that are sent over LBA storage bus interface 28 to NVM flash memory 68 controlled by NVM controllers 76. Host data may be alternately assigned to flash memory in an interleaved fashion by virtual storage processor 140 or by smart storage transaction manager 36. NVM controller 76 may then perform a lower-level interleaving among NVM flash memory 68. Thus interleaving may be performed on two levels, both at a higher level by smart storage transaction manager 36 among two or more NVM controllers 76, and by each NVM controller 76 among NVM flash memory 68.

NVM controller 76 performs logical-to-physical remapping as part of a flash translation layer function, which converts LBA's received on LBA storage bus interface 28 to PBA's that address actual non-volatile memory blocks in NVM flash memory 68. NVM controller 76 may perform wear-leveling and bad-block remapping and other management functions at a lower level.

When operating in single-endpoint mode, smart storage transaction manager 36 not only buffers data using virtual buffer bridge 32, but can also re-order packets for transactions from the host. A transaction may have several packets, such as an initial command packet to start a memory read, a data packet from the memory device back to the host, and a handshake packet to end the transaction. Rather than have all packets for a first transaction complete before the next transaction begins, packets for the next transaction can be re-ordered by smart storage switch 30 and sent to NVM controller 76 before completion of the first transaction. This allows more time for memory access to occur for the next transaction. Transactions are thus overlapped by re-ordering packets.

Packets sent over LBA storage bus interface 28 are re-ordered relative to the packet order on host storage bus 18. Transaction manager 36 may overlap and interleave transactions to different NVM flash memory 68 controlled by NVM controllers 76, allowing for improved data throughput. For example, packets for several incoming host transactions are stored in SDRAM buffer 60 via virtual buffer bridge 32 or an associated buffer (not shown). Transaction manager 36 examines these buffered transactions and packets and re-orders the packets before sending them over internal bus 38 to virtual storage bridge 42, 43, then to one of the downstream flash storage blocks via NVM controllers 76.

A packet to begin a memory read of a flash block through bridge 43 may be re-ordered ahead of a packet ending a read of another flash block through bridge 42 to allow access to begin earlier for the second flash block.

Encryption and decryption of data may be performed by encryptor/decryptor 35 for data passing over host storage bus 18. Upstream interface 34 may be configured to divert data streams through encryptor/decryptor 35, which can be controlled by a software or hardware switch to enable or disable the function. This function can be an Advanced Encryption Standard (AES), IEEE 1667 standard, etc, which will authenticate the transient storage devices with the host system either through hardware or software programming. The methodology can be referenced to U.S. application Ser. No. 11/924, 448, filed Oct. 25, 2007. Battery backup 47 can provide power to smart storage switch 30 when the primary power fails, allowing write data to be stored into flash. Thus a write-back caching scheme may be used with battery backup 47 rather than only a write-through scheme.

Mapper 46 in NVM controller 76 performs one level of mapping to NVM flash memory 68 that are MLC flash, or two levels of mapping to NVM flash memory 68 that are SLC or MLC flash. Data may be buffered in SDRAM 77 within NVM controller 76. NVM controller 76 and NVM flash memory 68 are part of Non-Volatile Memory Device (NVMD) 412. NVMD 412 are external to smart storage switch 30 in this embodiment. Smart storage switch 30 can be soldered to the board for MLCA 11.

Figure 1C:
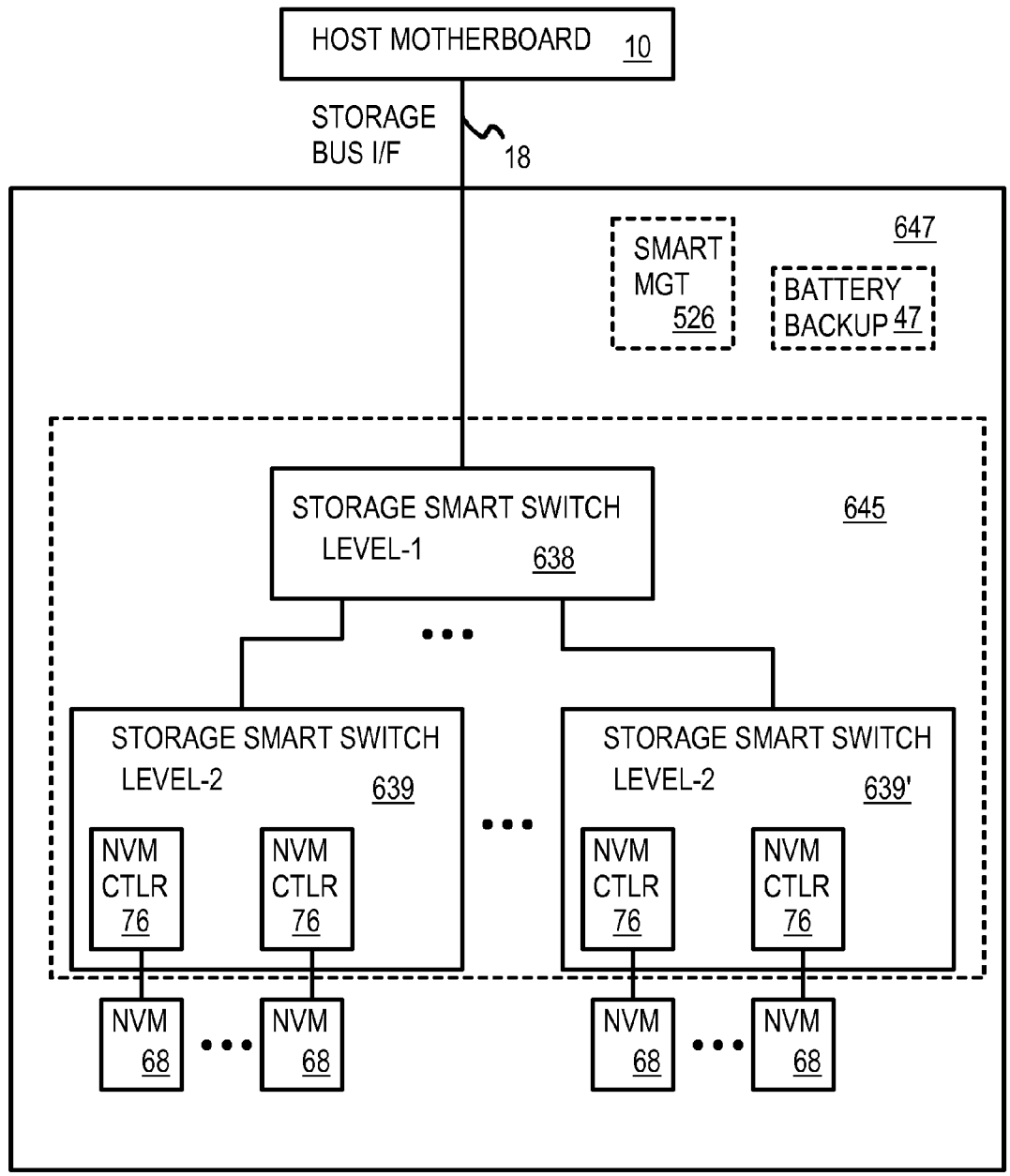
FIG. 1C shows two levels of smart storage switches using flash memory with multiple levels of integrated controllers.

FIG. 1C shows two levels of smart storage switches using flash memory with multiple levels of integrated controllers. First-level smart storage switch 638 is part of multi-level controller architecture (MLCA) and connects to host motherboard 10 over host storage bus 18. First-level smart storage switch 638 is connected to multiple second-level mart storage switches 639, 639.

Second-level smart storage switches 639, 639' connect to downstream flash storage using NVM controllers 76 that connect to NVM flash memory 68. Battery backup 47 can provide power to smart storage switches and other components in storage system 645 when the primary power fails, allowing write data to be stored into flash. Thus a write-back caching scheme may be used with battery backup 47 rather than only a write-through scheme. Remapping can be performed at a high level using optional smart manager 526 in external SSD system 647.

First-level smart storage switch 638 is used to interface to host 10 and connect to multiple second-level smart storage switches 639, 639'. Second-level smart storage switches 639, 639' further connect to multiple NVMDs as shown in FIGS. 1A and 1B. The ECC parity on all smart storage switches 638, 639, 639' can be turned on or off by selection of the user. In one embodiment, first-level smart storage switch 638 ECC parity is turned on and all smart storage switches 639, 639' have their ECC turned off. In another embodiment, first-level smart storage switch 638 has its ECC parity is turned off and all second-level smart storage switches 639, 639' have their ECC logic turned on. Cascading smart storage switches 638, 639, 639' can make the controllers less complicated. Storage system 645, smart manager 526, and battery backup 47 can be soldered to external SSD system 647.

Figure 1D:
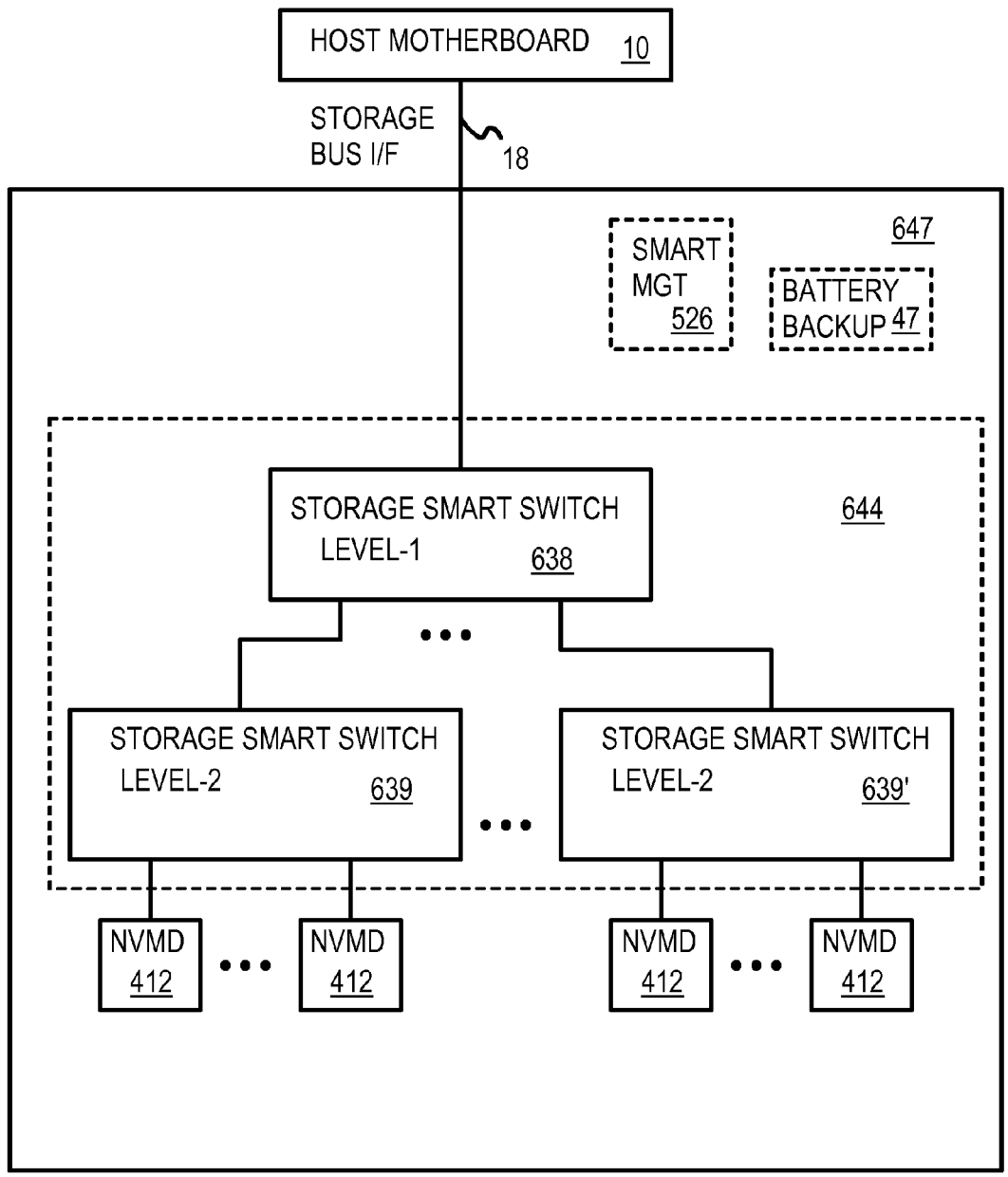
FIG. 1D shows two levels of smart storage switches controlling Non-Volatile Memory Devices (NVMD).

FIG. 1D shows two levels of smart storage switches controlling Non-Volatile Memory Devices (NVMD). First-level smart storage switch 638 is part of multi-level controller architecture (MLCA) and connects to host motherboard 10 over host storage bus 18. First-level smart storage switch 638 is connected to multiple second-level mart storage switches 639, 639.

Second-level mart storage switches 639, 639' connect to downstream Non-Volatile Memory Devices (NVMD) 412. Battery backup 47 can provide power to smart storage switches and other components in dual-level smart storage switch 644 when the primary power fails, allowing write data to be stored into flash. Thus a write-back caching scheme may be used with battery backup 47 rather than only a write-through scheme. Remapping can be performed at a high level using optional smart manager 526 in external SSD system 647.

In Multi-level flash memory architectures with more controllers involved in lower-level NVMD devices as shown in FIG. 1, flash memory capacity is actually increased since more independent address systems are used by individual lower-level mapping table adopted. Bad block amplification effect happening in one NVMD can be reduced to influence other NVM memory, which might have different locations of bad blocks occurring in transactions. Dual-level smart storage switch 644, smart manager 526, and battery backup 47 can be soldered to external SSD system 647.

Figure 2A:
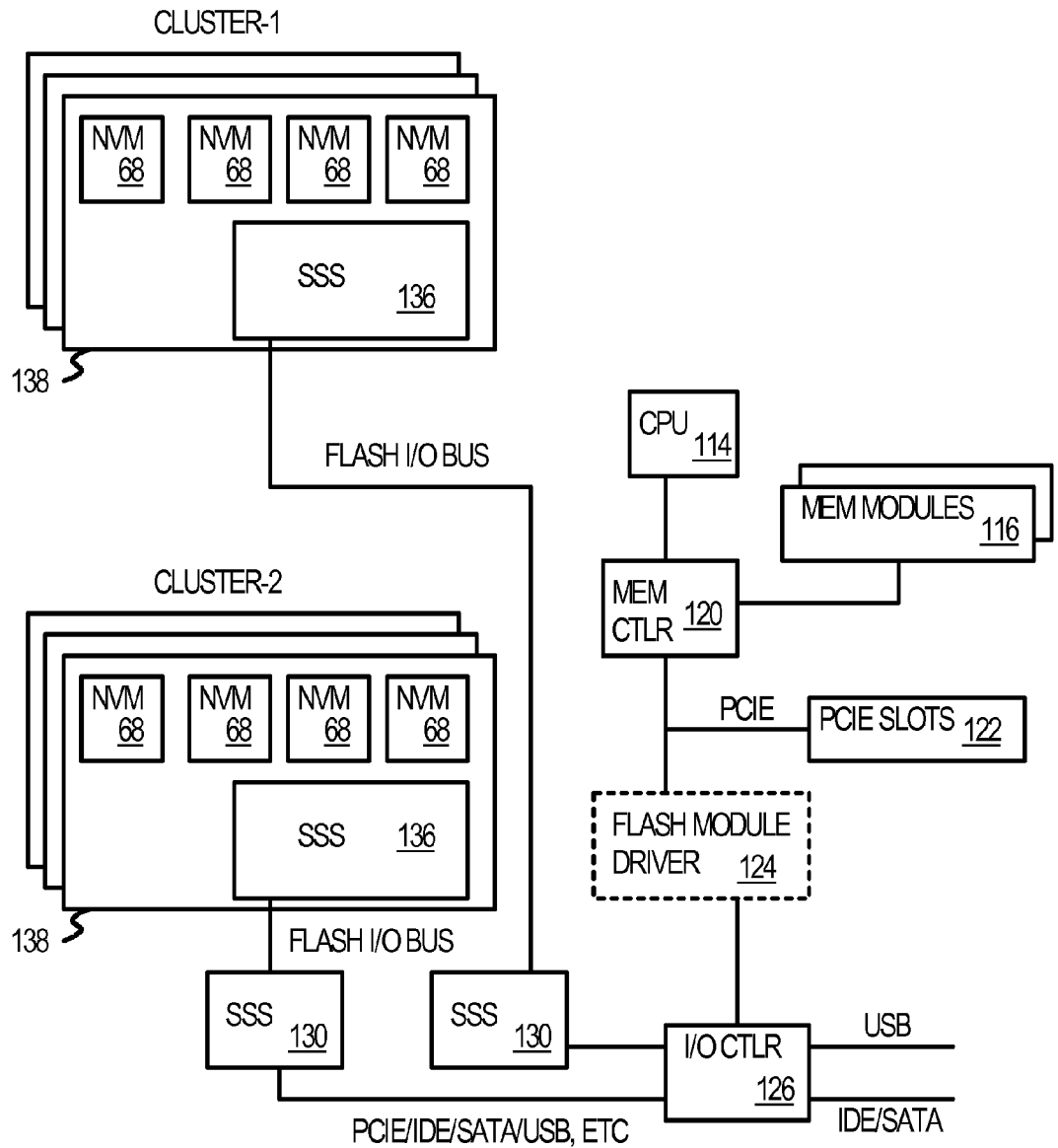
FIG. 2A shows a multi-level flash system with flash clusters.
Figure 2B:
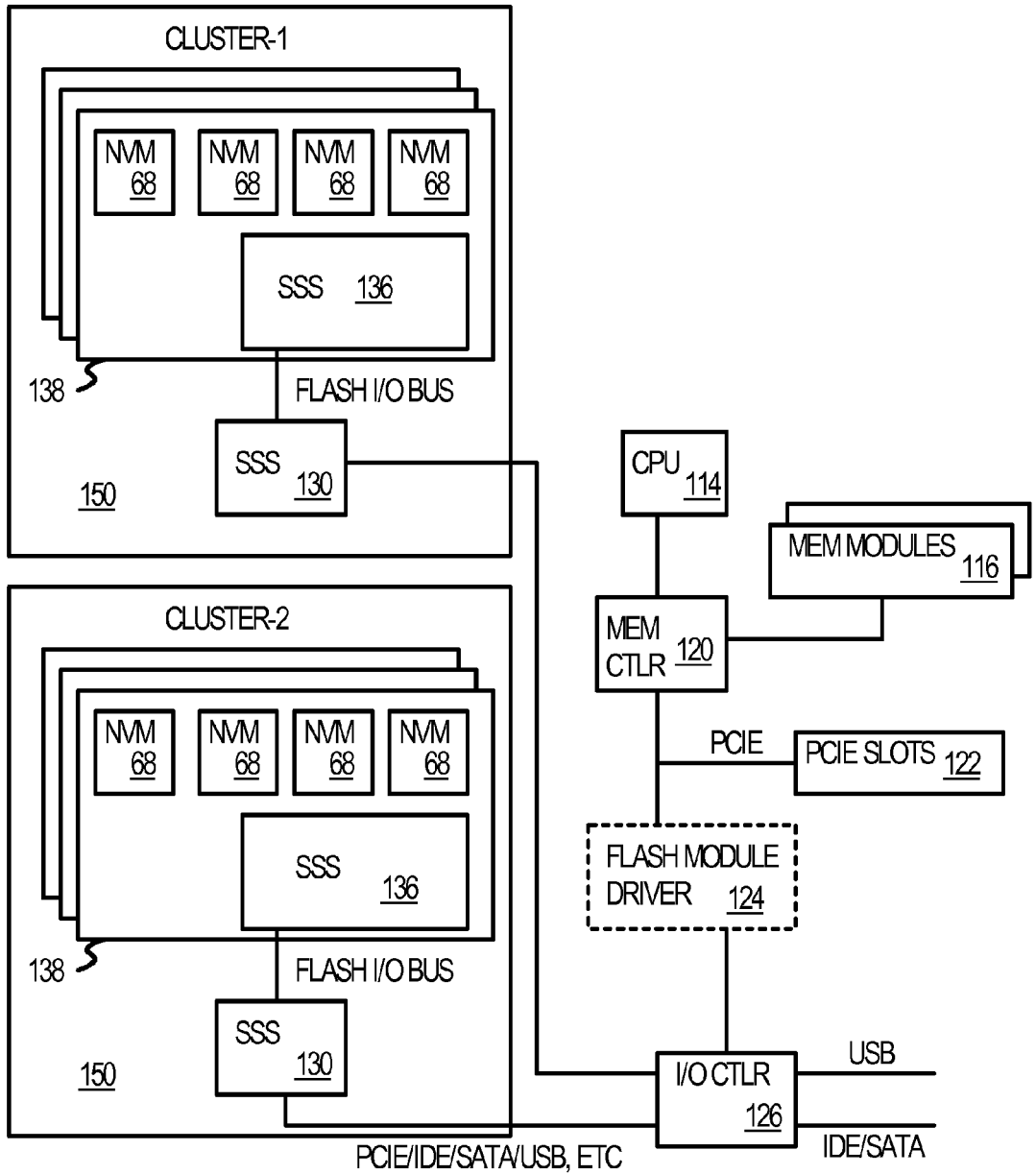
FIG. 2B shows a multi-level flash system with flash clusters on expansion cards.

Clustered Multi-Level Flash System—FIGS. 2A-B

FIG. 2A shows a multi-level flash system with flash clusters. Central Processing Unit (CPU) 114 can be a host that executes instructions and accesses data in dynamic-random-access memory (DRAM) memory modules 116 using memory controller 120. Local expansion cards in PCIE slots 122 are accessed over a local PCIE bus from memory controller 120. Other remote devices such as hard disks are accessed over USB, IDE, or SATA buses through I/O controller 126.

Flash module driver 124 is a program that executes on CPU 114 and accesses flash memory through I/O controller 126 by communicating with smart storage switches 130 over a PCIE, IDE, SATA, or USB bus. Flash module driver 124 can be programmed through a software driver interface, such as a Non-Volatile Memory Host Controller Interface (NVMHCI). Each first-level smart storage switch 130 drives a flash I/O bus that connects to a second-level smart storage switch 136 in cluster 138 of flash modules. Cluster 138 contains NVM flash memory 68 that store data in flash memory cells. When two levels of smart storage switches are used, such as highlighted in FIG. 1C, Redundant Array of Individual Disks (RAID) functions can be performed by first-level smart storage switches 130 or by second-level smart storage switches 136. Alternatively, all the components of smart storage switches 130 and cluster 138 can be Surface Mounted or located on the same card.

FIG. 2B shows a multi-level flash system with flash clusters on expansion cards. CPU 114 through I/O controller 126 operate as described for FIG. 2A to access smart storage switches 130. Cluster cards 150 each contain smart storage switch 130 and cluster 138 of modules with NVM flash memory 68. Cluster cards 150 can be PCIE cards or another kind of card. Alternatively, all the components of smart storage switches 130 and cluster cards 150 can be Surface Mounted or located on the same card.

Figure 3A:
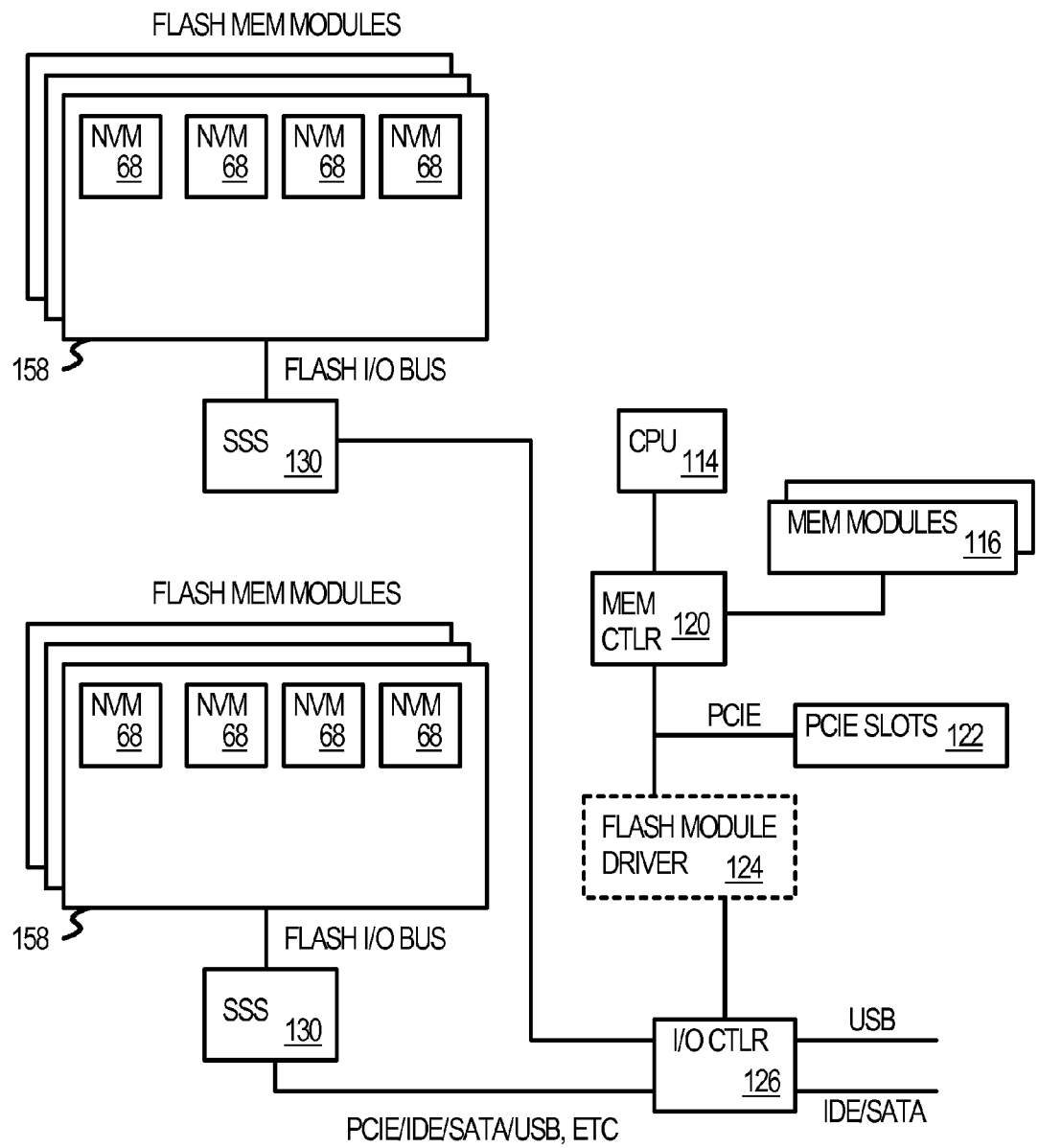
FIG. 3A shows a multi-level flash system with flash modules on expansion cards.

FIG. 3A shows a multi-level flash system with flash modules on expansion cards. CPU 114 through I/O controller 126 operate as described for FIG. 2A to access smart storage switches 130. A flash I/O bus from smart storage switch 130 connects to NVM flash memory 68 on flash memory modules 158. Alternatively, all the components of smart storage switches 130 and flash memory modules 158 can be Surface Mounted or located on the same card.

Figure 3B:
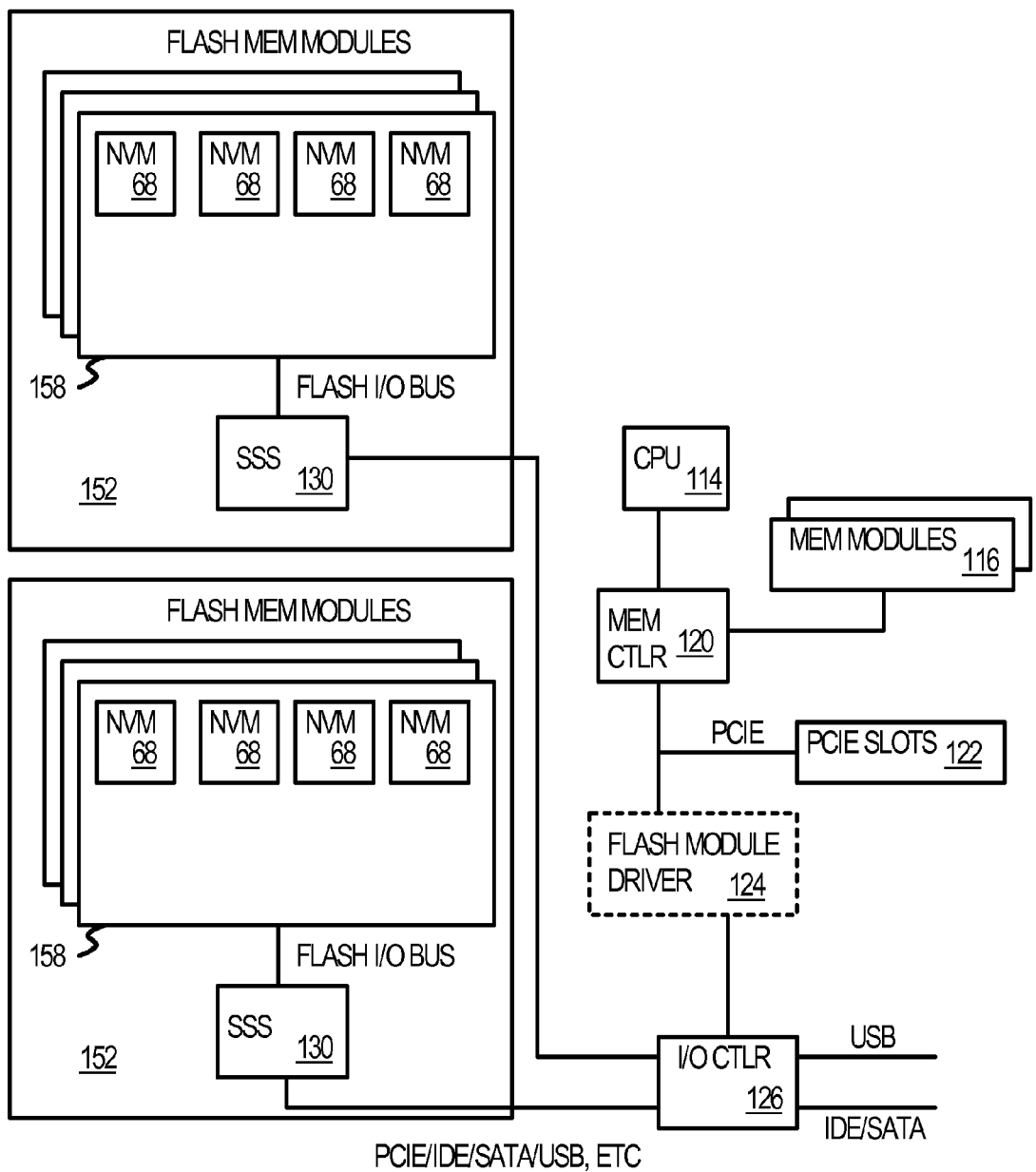
FIG. 3B shows a multi-level flash system with flash modules on expansion cards.

FIG. 3B shows a multi-level flash system with flash modules on expansion cards. CPU 114 through I/O controller 126 operate as described for FIG. 2A to access smart storage switches 130. Cards 152 each contain smart storage switch 130 and flash memory modules 158 with NVM flash memory 68. Cards 150 can be PCIE cards or another kind of card. Alternatively, all the components of smart storage switches 130 and flash memory modules 158 can be Surface Mounted or located on the same card.

Figure 4A:
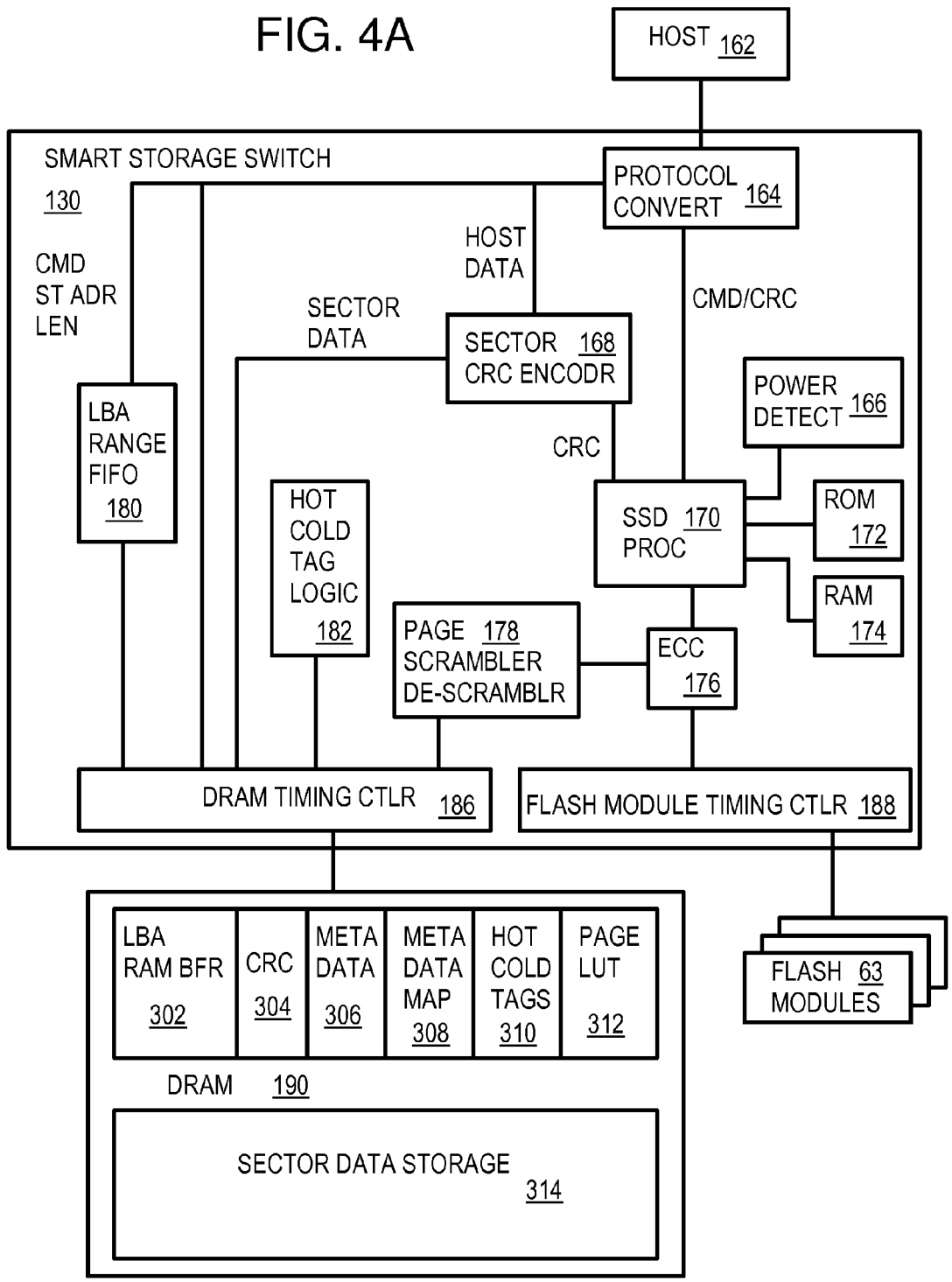
FIG. 4A is a block diagram of a smart storage switch that is enhanced for reducing write amplification.

FIG. 4A is a block diagram of a smart storage switch that is enhanced for reducing write amplification. Host 162 sends commands and data to smart storage switch 130 using a host protocol such as PCIE, IDE, SATA, or USB. Protocol converter 164 replies to the host commands using the host's protocol. Commands, Logical-Block-Address (LBA) starting addresses, and transfer lengths (LEN) are loaded into LBA range FIFO 180, while host commands are also sent to Solid-State-Disk (SSD) processor 170 which controls operating sequences within smart storage switch 130. SSD processor 170 executes code in ROM 172 and uses RAM 174 for execution of operation sequences. Power detector 166 detects power surges or power loss and activates SSD processor 170 to quickly backup data to flash when power fails.

A cyclical-redundancy-check (CRC) is generated from the host data by sector CRC generator 168 and the generated CRC is compared to the CRC sent by host 162. SSD processor 170 can ask host 162 to resend the data when the CRC's mismatch. Otherwise, the CRC is stored in CRC storage 304 in DRAM 190. The sector data from the host is stored in sector data storage 314 of DRAM 190.

The command entries in LBA range FIFO 180 are managed and merged by SSD processor 170 and then loaded into LBA RAM buffer 302 in DRAM 190. Page look-up table (LUT) 312 is managed by SSD processor 170 as a page map of logical addresses to physical pages in flash modules 63. Hot-cold tag logic 182 examines hot-cold tags 310 to find cold entries in DRAM 190 that can be moved to flash modules 63.

Sector data storage 314 is read using DRAM timing controller 186 and written to flash modules 63 by flash module timing controller 188. Various kinds and arrangements of flash cards, modules, devices, or NVM flash memory 68 may be substituted for flash modules 63, such as shown in FIGS. 1A-3B.

Page data may be scrambled by page scrambler/descrambler 178 and an error-correction code (ECC) generates or checked by ECC unit 176 as data is transferred between DRAM 190 and flash modules 63. Scrambling data can secure it from unauthorized access. Scrambling can disrupt a long string of 1's to improve performance of the ECC unit.

FIG. 4B is a block diagram of a simplified smart storage switch. Battery backup device 192 keeps smart storage switch 135 operating during power loss. When power detector 166 detects a power loss, or when routine backup controller 171 signals that a backup should begin, data from DRAM 190 is copied to flash modules 63 from DRAM timing controller 186 to flash module timing controller 188 through enabling gate 187. Sector data from host 162 can also be sent directly to flash modules 63 rather than through DRAM 190.

Figure 5:
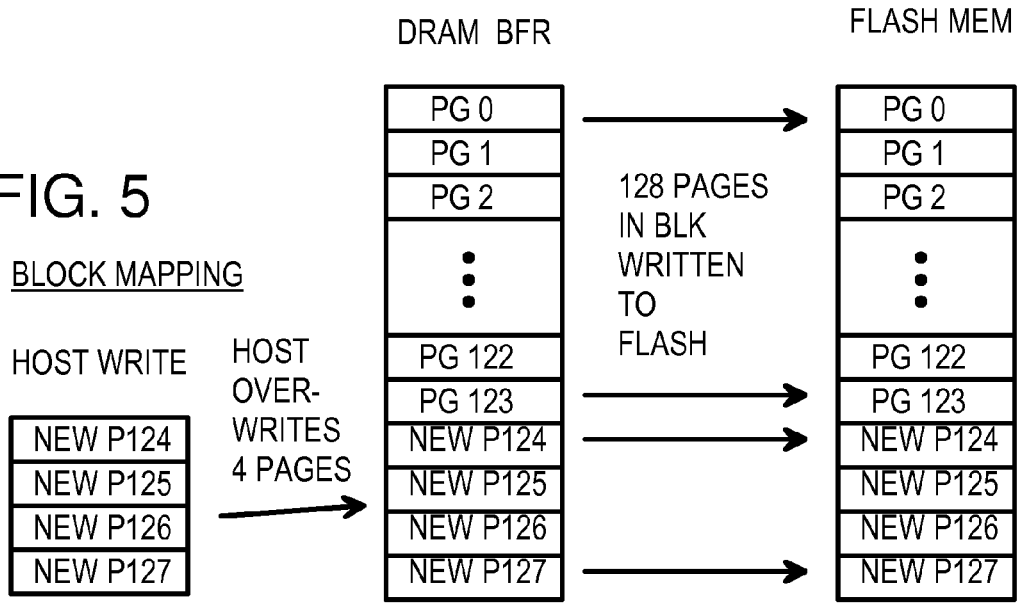
FIG. 5 highlights the write acceleration problem for flash drives with block mapping.

FIG. 5 highlights the write acceleration problem for flash drives with block mapping. The inventors have discovered that number of writes to flash may be larger than the number of writes from the host. This is especially true of MLC flash systems that have restrictions on the sequence of writes to flash memory. These restrictions may cause additional flash writes that would not be necessary if less restrictive SLC flash memory were used. A lookup table that is block mapped is especially prone to this problem.

In FIG. 5, a host over-writes 4 pages of data, pages 124 to 127. The stale copies of the four pages of data are stored in a DRAM buffer cache used by the flash drive system that is caching the entire block of pages. Updating the four pages causes the entire block of 128 pages to be written back to flash memory. Thus a write amplification of 128/4 or 32× occurs, since the 4 pages of host data caused 128 pages to be written to the flash memory.

Figure 6:
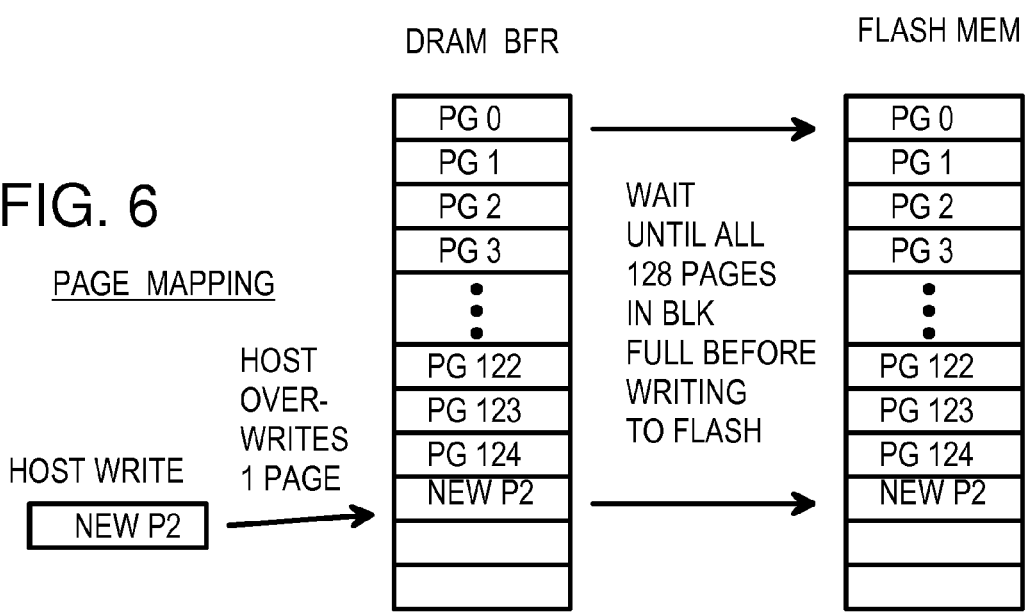
FIG. 6 highlights reduced write acceleration with page mapping.

FIG. 6 highlights reduced write acceleration with page mapping. The host writes new data to page 2. In this example, the lookup table is page-mapped rather than block-mapped. Page 2 may be mapped to any location within a block using page mapping. In the example of FIG. 6, page 2 is mapped to page 125 of the block that is cached in the DRAM buffer. The flash drive waits to write the page to flash memory. Delaying write backs to flash can reduce write acceleration. However, a much larger lookup table is needed for page mapping than for block mapping. This may require that the lookup table be stored in flash memory and portions of the lookup table cached in the DRAM.

Also, since pages can be stored at any page location within a block, the host's pages may be scattered. Clean up after a power failure is more difficult.

Flash Writes Delayed Until Next Host Read—FIG. 7

FIGS. 7A-C show delaying writes to flash until a host read occurs. In FIG. 7A, a sequence of three host writes W1, W2, W3, is followed by a host read, R4. The starting LBA and transfer lengths LEN are shown in the table. In this example, the lengths refer to 512-byte sectors, but could refer to larger transfer units, such as 4 KB pages.

FIG. 7B shows the sectors for each of the writes and read. First write W1 starts at LBA 100 and ends at LBA 104, which is a transfer length of 5 sectors. Second write W2 starts at LBA 103 and ends at LBA 106, which is a transfer length of 4 sectors. Sector data for LBA's 103 and 104 in W2 are more recent that the sector data from first write W1. Third write W3 starts at LBA 96 and ends at LBA 100, which is a transfer length of 5 sectors.

Read R4 reads the most-recently-written data for LBA 98 to 104, a transfer length of 5. Sector data 98, 99, 100 are taken from third write W2, while sector data 100 from first write W1 is discarded. Sector data 101, 102 are read from first write W1.

In FIG. 7C, write to flash occurs after the host read. Sector data from writes W1, W2, W3 are buffered in the DRAM and are not immediately sent to flash memory. This allows time for the host to over-write the data. Once the host issues a read, the most-recent write data is sent to the flash memory for writing. Stale write data is discarded.

In FIG. 7C, after read R4 occurs, sector data 96-100 from write W3, sector data 101, 102 from first write W1, and sector data 103-106 from second write W2 are merged together and written to flash memory.

A total of 11 sectors are written to flash. Writes W1, W2, W3 had a total of 14 sectors from the host, so the total number of sectors written to flash was reduced by 3 sectors in this example.

Waiting until a host read allows the host time to over-write data that it recently wrote. The host may be executing a program that updates data within the same page or sector, either by over-writing data bytes within a sector, or by slowly writing different bytes within that sector. The host may wait to read until it finishes these data updates; thus delaying writes to flash until the host reads can be quite effective in reducing write acceleration.

FIGS. 8A-C highlight data alignment when writing to flash memory. In FIG. 8A, the host writes W1, W2, W3 are followed by host read R4. Starting LBA's and transfer lengths LEN are also received from the host.

Transfers are aligned within smart storage switch 130 to the nearest 4-sector boundary. This may require pre-fetching before the starting LBA, or post-fetching after the end of the host transfer to reach then next boundary. The boundary to pre-fetch from is shown in FIG. 8A as X LBA while the LBA at the boundary to post-fetch to is shown as Y LBA. The pre-fetch length is Y LEN and the post-fetch length is Y LEN.

FIG. 8B shows the pre-fetched and post-fetched sectors in dashed outlines labeled X and Y, respectively. For example, second write W2 has a starting LBA of 103 which is not aligned, and a X LBA of 100 with an X LEN of 3 sectors (100, 101, 102). Sectors 103-106 are the host transfer. Since 106 is not aligned, one more sector is post-fetched, sector 107. A total of 8 sectors is cached in the DRAM buffer. The pre-fetched and post-fetched sectors 100-102, 107, are fetched from flash or DRAM, while the host sectors 103-106 are received from the host.

The read R4 takes data from the most recent write. The read is also aligned, so sectors 96, 97 are the X LEN sectors while sector 103 is the Y LEN sector. Host-requested sectors 96-100 are taken from third write W3, while sectors 101-102 are taken from first write W1. Sector 103 is taken from second write W2.

In FIG. 8C, the read causes the write data to be sent to the flash memory. The flash write is aligned to 4-sector boundaries, starting at LBA 96 and ending with LBA 107. Sectors 96-100 are taken from third write W3, sectors 101, 102 are taken from first write W1, sectors 103-106 are taken from second write W2, and sector 107 was post-fetched for write W1.

Figure 9:
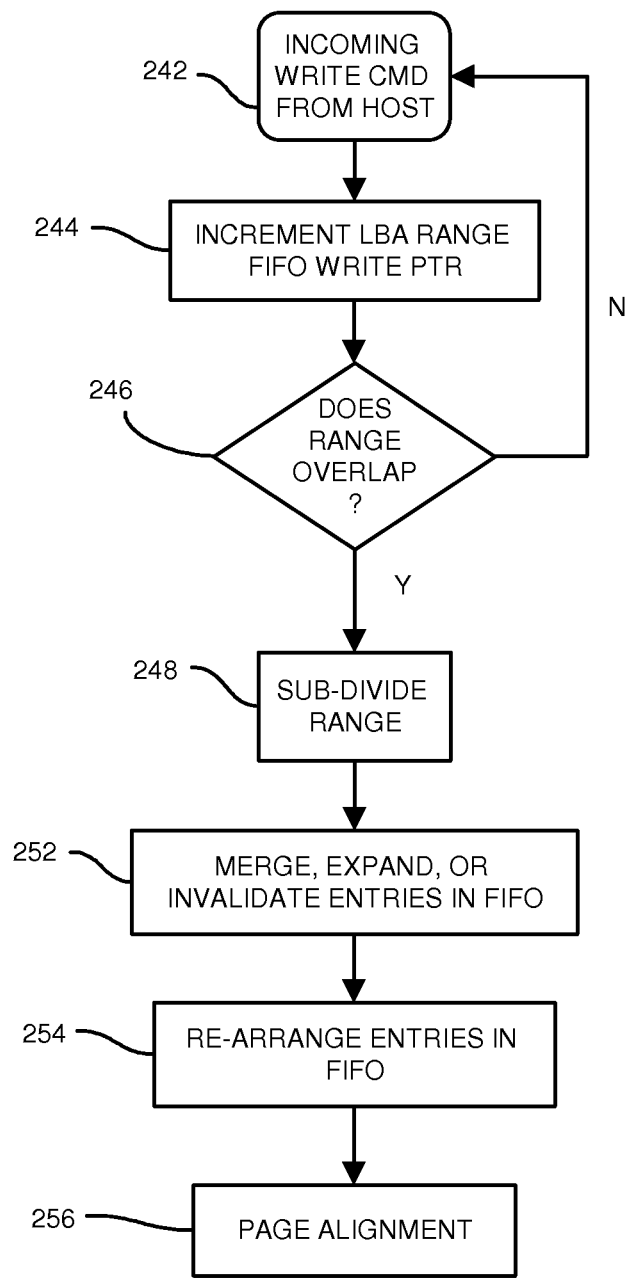
FIG. 9 is a flowchart of the LBA range FIFO processing host commands.

FIG. 9 is a flowchart of the LBA range FIFO processing host commands. Protocol converter 164 receives the host write command, step 242, which is loaded into an entry in LBA range FIFO 180 and the write pointer incremented, step 244. If the range of sectors transferred does not overlap with ranges of other commands in LBA range FIFO 180, step 246, then loading of the FIFO is complete and protocol converter 164 can wait for the next command from the host, step 242.

When there is a range overlap, step 246, the ranges of the two or more overlapping entries are sub-divided at the transfer boundaries, step 248. New entries in flash management 108 are created for the sub-divided ranges. The sub-divided entries are then merged, expanded, or invalidated in LBA range FIFO 180, step 252. See the example in FIG. 10.

The entries in LBA range FIFO 180 may then be re-arranged, step 254. Page alignment, such as shown in FIG. 8, may be preformed by pre-fetching and post-fetching sectors from flash or DRAM, step 256, for X and Y regions. The entries in LBA range FIFO 180 are then aligned to page boundaries, such as for 4-sector pages.

Figure 10E:
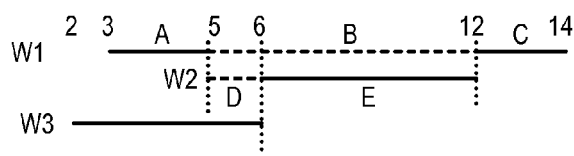

FIGS. 10A-G show an example of operation of the LBA range FIFO. FIG. 10A is a table of four writes W1-W4 and one read R5 received from the host. FIG. 10B shows the sector data from the host loaded into the sector data buffer in DRAM 190. Sectors S3-S14 are written starting at location 1 in the DRAM buffer, while sectors S5-S12 are written in starting at location 13. Sector data for write W3 is written starting at location 21 while write W4 is written starting at location 26. The sector data is thus simply written into the DRAM buffer in the order received with no attempt to align the data.

In FIG. 10C, first write W1 has sectors S3-S14 at LBA 3-14. The first entry in LBA range FIFO 180 has the sequence number set to 1 and buffer location 1 stored to point to the location of W1's data in the DRAM buffer shown in FIG. 10B. The starting LBA and LEN from the host are also stored in the first entry, and a valid bit is set.

In FIG. 10D, the second write W2 has been received. The first write W1 is split or sub-divided into three regions A, B, C at the boundaries of second write W2, which begins at LBA 5 and ends at LBA 12.

Two additional entries for first write W1 are created in LBA range FIFO 180 and all have their sequence number set to 1 to indicate first write W1. The starting LBA's of the 3 regions are set to 3, 5, and 13, and the lengths adjusted to 2, 8, and 2 sectors. This matches the three sub-divided regions shown to the left in FIG. 10D for write W1. The buffer locations of 1, 3, and 11 correspond to the locations of sectors S1, S3, and S11 in the DRAM buffer of FIG. 11B.

The valid bit for the second entry is cleared, since these sectors S5-S12 overlap with second write W2. This data from W1 is stale. An entry for second write W2 is also loaded into LBA range FIFO 180, having a sequence number of 2, a starting LBA of 5, and a length of 8. The data for W2 is located starting at buffer location 13, as seen in FIG. 10B.

In FIG. 10E, the third write W2 has been received. The second write W2 is split or sub-divided into two regions D, E at the boundaries of third write W3, which begins at LBA 2 and ends at LBA 5. Third write W2 only partially overlaps second write W2. Since W3 overlaps region A of first write W1, region A's entry is invalidated in LBA range FIFO 180.

An additional entry for second write W2 is created in LBA range FIFO 180 and has its sequence number set to 2 to indicate second write W2. The starting LBA's of the 2 regions are set to 5 and 7, and the lengths adjusted to 2 and 6 sectors. This matches the two sub-divided regions shown to the left in FIG. 10E for write W2. The buffer locations of 13 and 15 correspond to the locations of sectors S5 and S7 in the DRAM buffer of FIG. 11B. These entries are labeled D and E.

The valid bit for the entry D is cleared, since these sectors S5-S6 overlap with third write W3. This data from W2 is stale. An entry for third write W3 is also loaded into LBA range FIFO 180, having a sequence number of 3, a starting LBA of 2, and a length of 5. The data for W3 is located starting at buffer location 21, as seen in FIG. 10B.

Figure 10F:
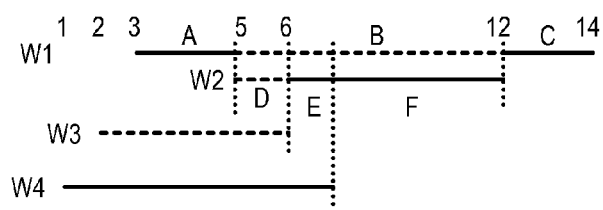

In FIG. 10F, the fourth write W4 has been received. The entry for third write W3 is invalidated, since its sectors S2-S6 are completely overlapped by fourth write W4. A new entry F is created for second write W2, which is split from entry E at the boundary of fourth write W4 at LBA 8. Entry E is invalidated since it completely overlaps fourth write W4.

An entry for fourth write W4 is also loaded into LBA range FIFO 180, having a sequence number of 4, a starting LBA of 1, and a length of 7. The data for W4 is located starting at buffer location 26, as seen in FIG. 10B.

Figure 10G:
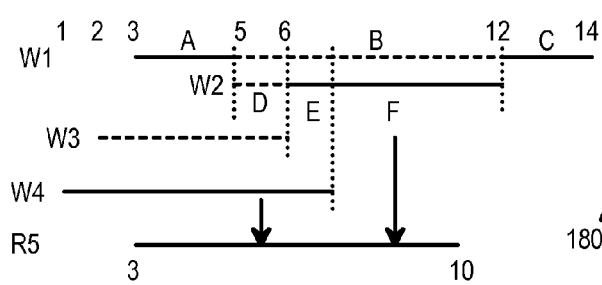

In FIG. 10G, a host read occurs. The most recent sector data is read back to the host. Read R5 gets sectors S3 to S7 from write W4, which is stored in the DRAM buffer starting at location 28. Sectors S8 to S10 are read from the data stored for write W2, as indicated by entry F. This data is stored starting at location 16 in the DRAM buffer shown in FIG. 10B.

The most-recent data can be quickly found by searching LBA range FIFO 180 from the bottom, ignoring entries with valid bits set to 0. Finally, all the valid entries can have their data read, and the data written to flash memory. Once the flash write is performed, the entries can be erased or reused.

Figure 11A:
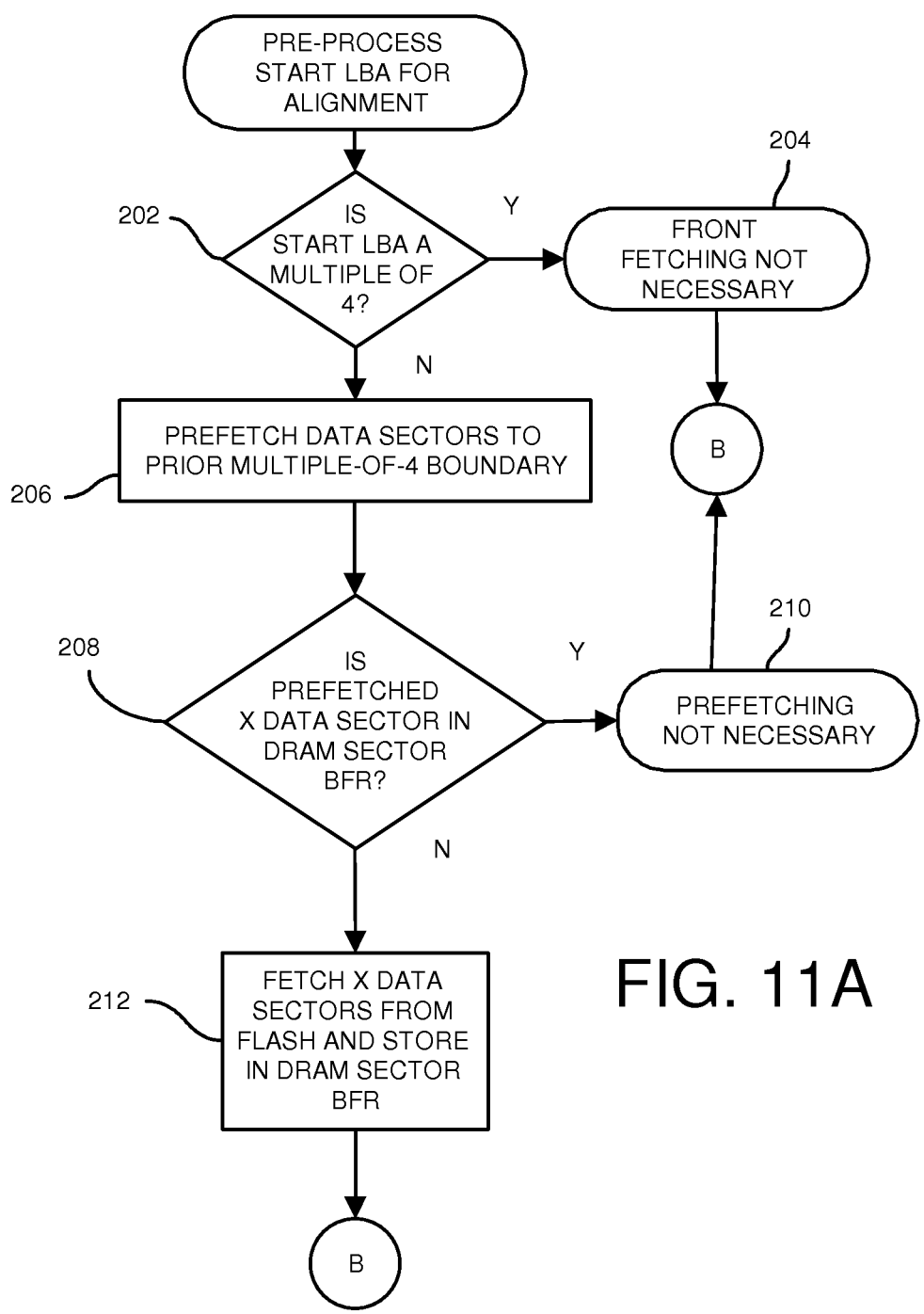
FIGS. 11A-B shows a flowchart of pre-fetching and back-fetching for data alignment.
Figure 11B:
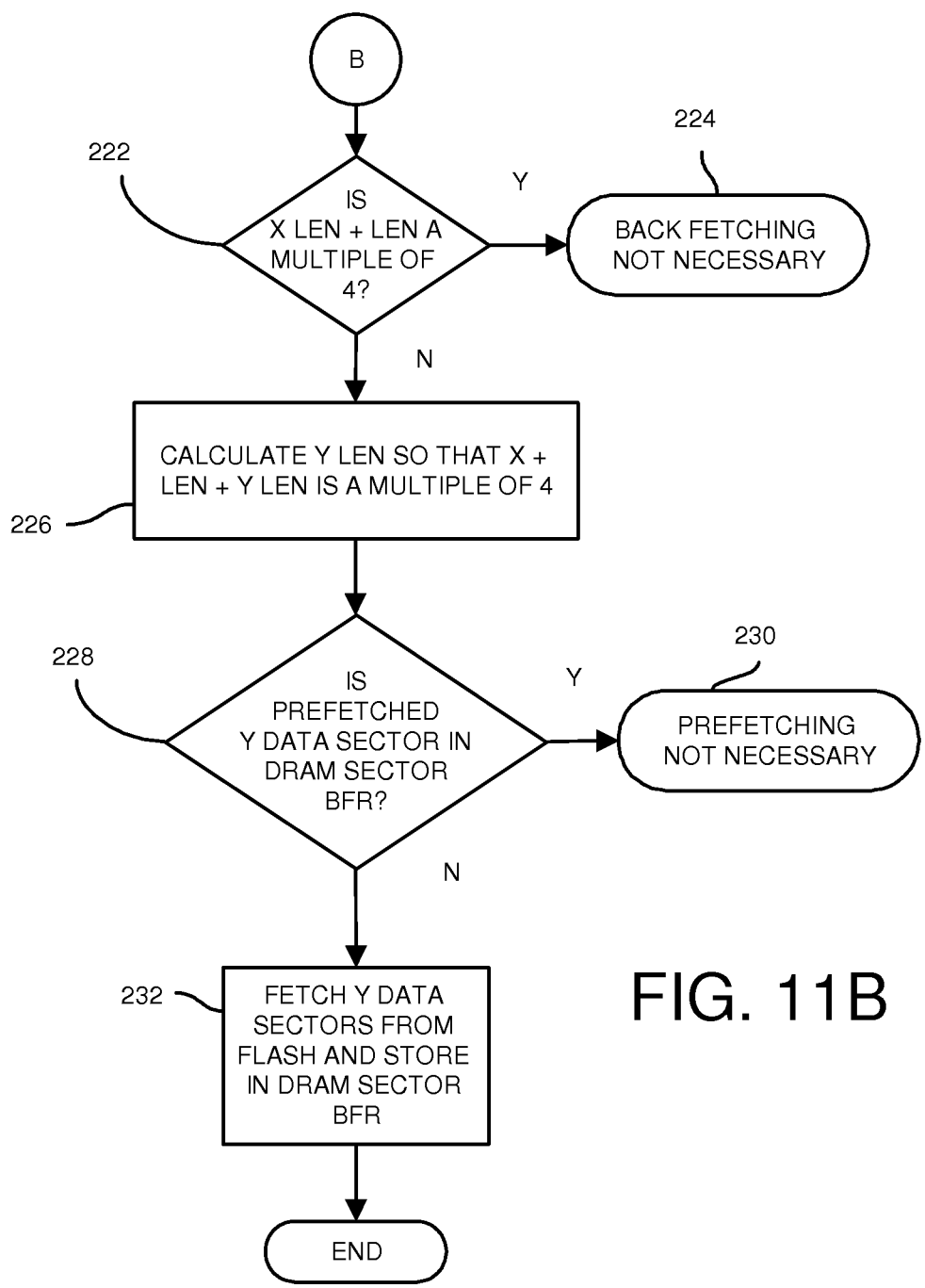

FIGS. 11A-B shows a flowchart of pre-fetching and back-fetching for data alignment. In FIG. 11A, a new command has been entered into LBA range FIFO 180. The smart storage switch processor or other logic checks to determine if the transfer's starting LBA is a multiple of four, step 202, which is a page boundary in this example. When the starting LBA is a multiple of four, step 202, then no pre-fetching is needed for the front of the transfer, step 204, and the process continues with FIG. 11B.

When the starting LBA is not a multiple of 4, step 202, then the start of the host transfer is not aligned. Data sectors from the prior 4-sector boundary to the sector before starting LBA need to be pre-fetched, step 206. If all the data sectors in the X region are present in the DRAM cache buffer, step 208, then additional prefetching from flash is not needed, step 210, and the process continues with FIG. 11B.

When one or more sectors in the X region is not present in the DRAM cache buffer, step 208, then the X data sectors are fetched from flash memory, step 212, and stored in the DRAM cache buffer. When some but not all of the X data sectors are present in the DRAM cache buffer, then the sectors may be merged so that the most recent data sectors are present in the DRAM cache buffer.

The process continues with FIG. 11B. When the transfer length LEN plus the X region length X LEN is a multiple of four, step 222, then back fetching is not needed, step 224. Otherwise, the Y region length Y LEN is calculated so that X LEN+LEN+Y LEN is a multiple of 4, step 226.

If all the data sectors in the Y region are present in the DRAM cache buffer, step 228, then additional back-fetching from flash is not needed, step 230.

When one or more sectors in the Y region is not present in the DRAM cache buffer, step 228, then the Y data sectors are fetched from flash memory, step 232, and stored in the DRAM cache buffer. When some but not all of the Y data sectors are present in the DRAM cache buffer, then the sectors may be merged so that the most recent data sectors are present in the DRAM cache buffer.

Figure 12A:
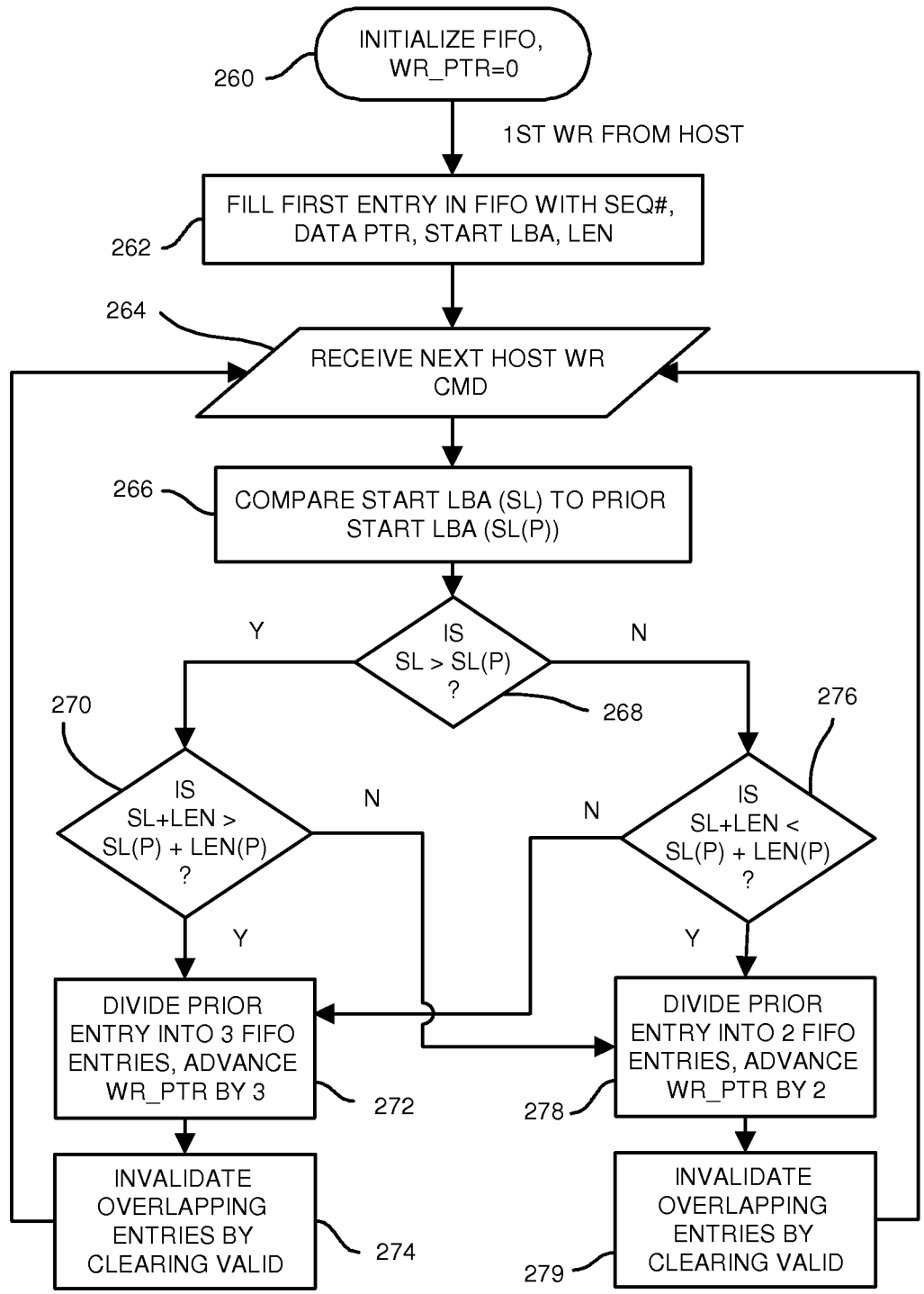
FIGS. 12A-B shows a flowchart of operation of the LBA range FIFO, including sub-dividing entries.
Figure 12B:
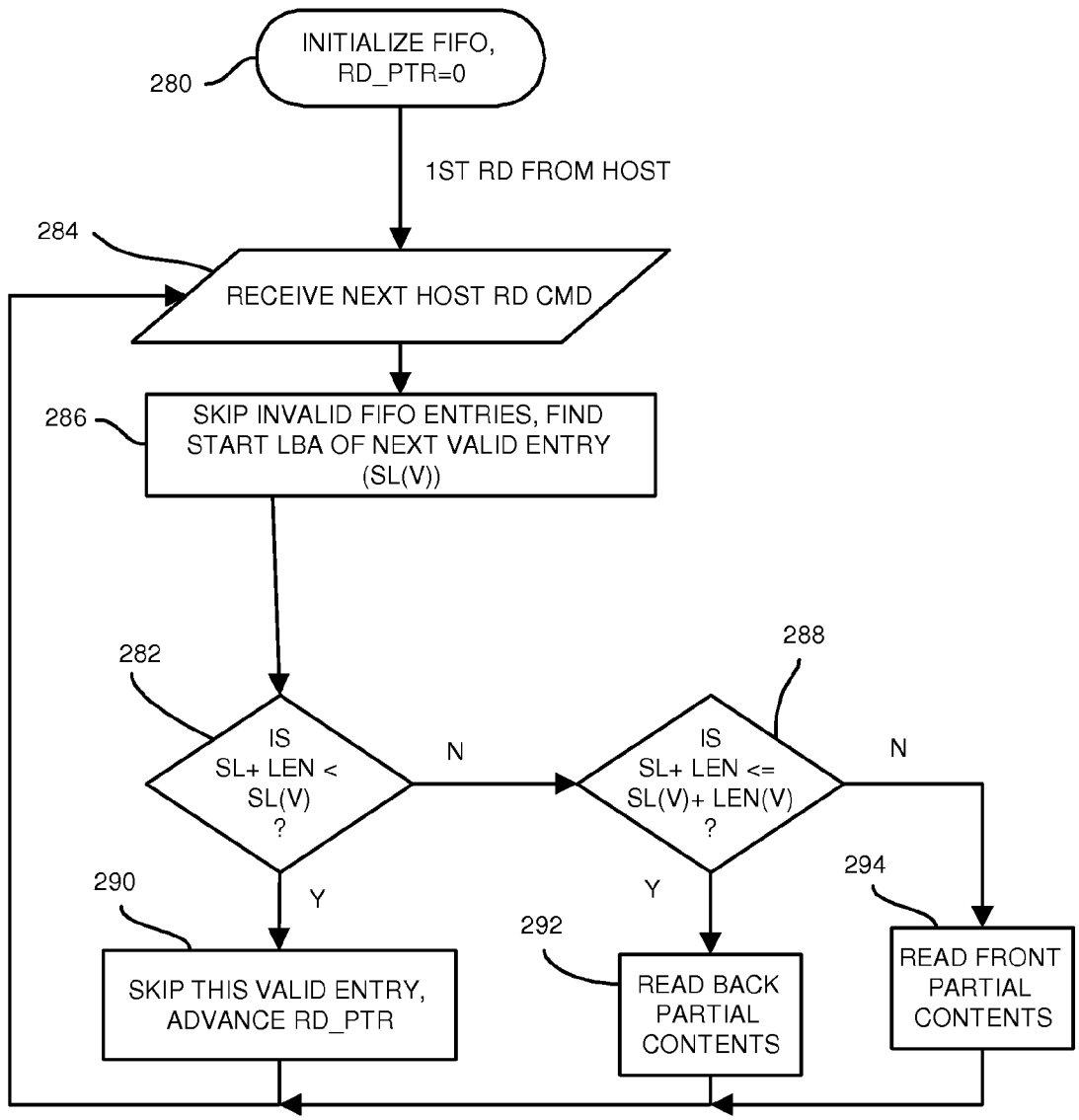

FIGS. 12A-B shows a flowchart of operation of the LBA range FIFO, including sub-dividing entries. LBA range FIFO 180 is initialized by setting the write pointer to zero, step 260. When the first write command from the host is received, the first entry in the LBA range FIFO is filled with an internal sequence number, a pointer to the location in the DRAM cache buffer that the host's data is stored at, the starting LBA, and the transfer lengths LEN from the host, step 262. The sequence number can be generated from an up counter or from some other logic.

When the next write command from the host is received, step 264, then the starting LBA for that new host command is compared to the starting LBA's for all valid entries in LBA range FIFO 180, step 266. If there is no possibility of overlap, then the routine waits for the next write from the host, step 264. A new entry in the FIFO is loaded and validated when no overlap is possible.

When the starting LBA (SL) is greater than the starting LBA of a previous entry in the LBA range FIFO, SL(P), step 268, and the new transfer extends beyond the end of the previous entry, which is determined by SL+LEN being greater than SL(P)+LEN(P), step 270, then the previous entry is sub-divided into 3 entries, step 272, and the write pointer is incremented by 3. The sub-divided entries of the prior entry that overlap the new transfer are invalidated, step 274.

When the starting LBA (SL) is greater than the starting LBA of a previous entry in the LBA range FIFO, SL(P), step 268, but the new transfer does not extend beyond the end of the previous entry, which is determined by SL+LEN not being greater than SL(P)+LEN(P), step 270, then the previous entry is sub-divided into 2 entries, step 278, and the write pointer is incremented by 2. The sub-divided entries of the prior entry that overlap the new transfer are invalidated, step 279.

When the starting LBA (SL) is less than or equal to the starting LBA of a previous entry in the LBA range FIFO, SL(P), step 268, and the new transfer does not extend beyond the end of the previous entry, which is determined by SL+LEN being less than SL(P)+LEN(P), step 276, then the previous entry is sub-divided into 2 entries, step 278, and the write pointer is incremented by 2. The sub-divided entries of the prior entry that overlap the new transfer are invalidated, step 279.

When the starting LBA (SL) is less than or equal to the starting LBA of a previous entry in the LBA range FIFO, SL(P), step 268, and the new transfer does extend beyond the end of the previous entry, which is determined by SL+LEN not being less than SL(P)+LEN(P), step 276, then the previous entry is sub-divided into 3 entries, step 272, and the write pointer is incremented by 3. The sub-divided entries of the prior entry that overlap the new transfer are invalidated, step 274.

In FIG. 12B, the read pointer is initialized to zero, step 280, allowing the first read to be received from the host. As each read command is received, step 284, the most recent valid entry in LBA range FIFO 180 is found, step 286. Entries with cleared valid bits are skipped over. The starting LBA for this most recent valid entry is designated SL(V) and its length is LEN(V).

When SL+LEN for the read command is less than SL(V), step 282, there is no overlap. The entry can be skipped, step 290, and the read pointer advanced.

When SL+LEN for the read command is not less than SL(V), step 282, there is some overlap. When SL+LEN for the read command is less than or equal to SL(V)+LEN(V), step 288, there is overlap on the back end. The back overlapping sectors are read from the DRAM cache buffer, step 292.

When SL+LEN for the read command is not less than SL(V), step 282, there is some overlap. When SL+LEN for the read command is greater than SL(V)+LEN(V), step 288, there is overlap on the front end. The front overlapping sectors are read from the DRAM cache buffer, step 294.

Meta-Data to Reduce Write Acceleration

FIG. 13 highlights meta-data for matched patterns of sector data. Repeating patterns of data sometimes occur for sector data from the host. These repeated patterns can be replaced by a meta-data code or M-code. Since the M-code is much smaller than the data pattern, compression occurs.

When the sector data is all one's, or FFFF . . . FFFF, the M-code is FFF. A three-byte code can replace all bytes of sector data.

Another common pattern is a sector with all zeros. The M-code F00 indicates this pattern.

M-Code FAA indicates the binary pattern 1010 . . . 1010, or the hexadecimal pattern AAAA . . . AAAA. M-Code F55 indicates the binary pattern 0101 . . . 0101, or the hexadecimal pattern 5555 . . . 5555.

When any arbitrary first byte is repeated for the remaining bytes in a sector, the arbitrary repeated pattern can be encoded by the M-code FXX, where XX is the one-byte pattern of the first byte. For example, F8B encodes the repeated byte 8B, or 1000,1011.

Sometimes the first two bytes are repeated in the sector. When any arbitrary first two bytes are repeated for the remaining bytes in a sector, the arbitrary repeated pattern can be encoded by the M-code EXXXX, where XXXX is the two-byte pattern of the first byte. For example, EFF01 encodes the repeated bytes FF and 01, or 1111 1111 0000 0001. Many other codes and coding schemes could be substituted.

Merely Replacing Patterned Sectors with M-Codes Doesn't Reduce Flash Writes

However, simply replacing the sector with a 3 or 4-or-more byte M-code does not reduce write acceleration. Since flash memory is written an entire page at a time, the other remaining bytes in a sector are still written, but with dummy or default data.

The inventors have realized that when meta-data codes are used to represent sector data, the meta-data codes can be packed into a page of a special packed block of flash memory. The original sector is not written to flash at all. Many meta-data codes for many different sectors are accumulated in the DRAM until a full page of meta-data codes is created. Then the page of meta-data codes is written to flash. Or the meta-data codes can be accumulated in DRAM until a period of time elapses such as 1 hour or 1 day, or when power loss is detected, then the whole meta-data codes not written to flash can be written to flash. Since a page may contain a hundred or more meta-data codes, writes to flash can be reduced by a factor of a hundred for pattern-matched data sectors. If the meta-data codes stored in DRAM can be updated to flash less often it can reduce the writes even more.

Figure 14:
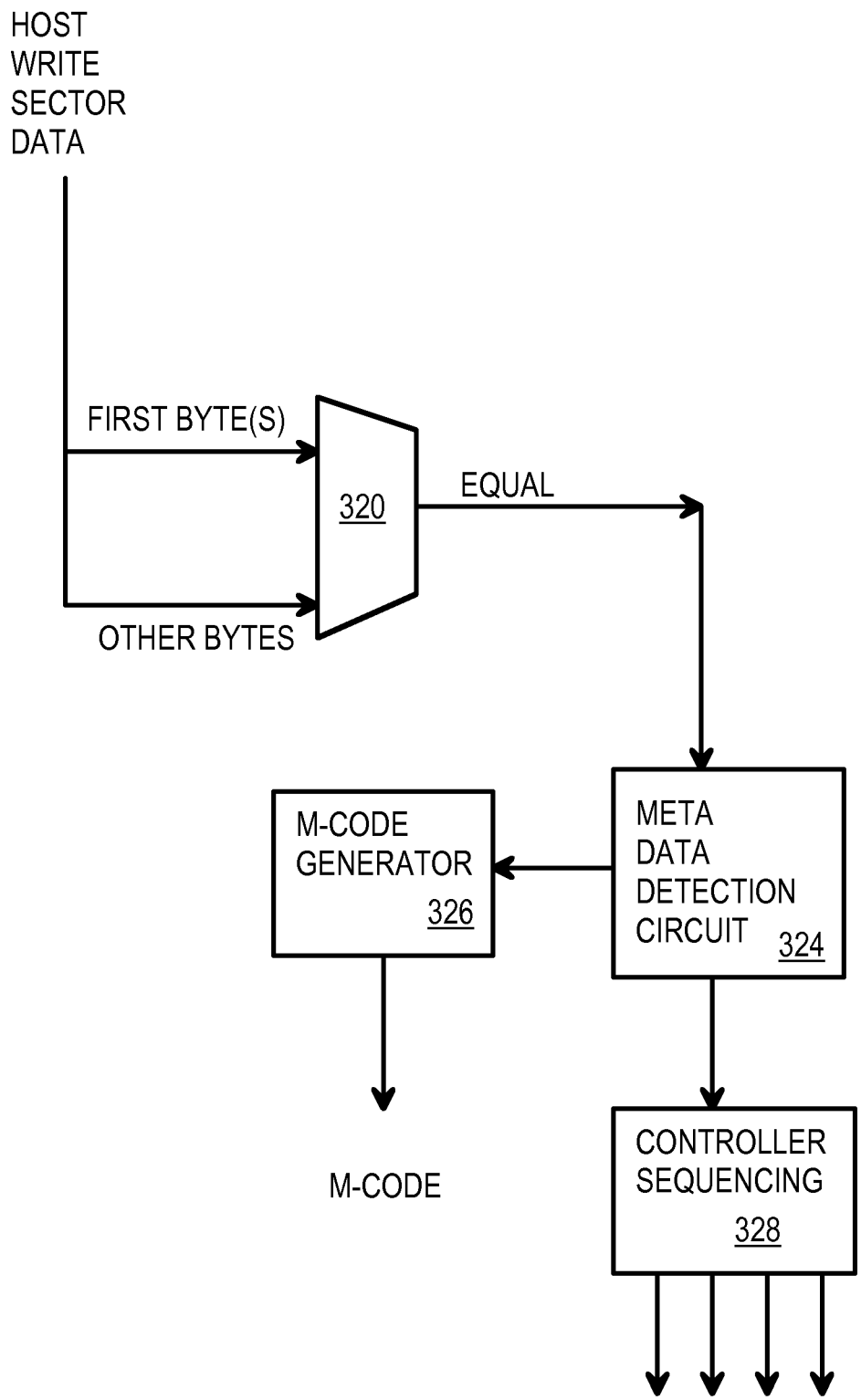
FIG. 14 shows a pattern matching circuit for generating meta-data codes.

FIG. 14 shows a pattern matching circuit for generating meta-data codes. The host data for the sector being written is applied to comparator 320, which successively compares the first one or two bytes in the sector to all successive bytes. When the first byte (or first 2 bytes) matches all remaining bytes, comparator 320 signals a match. Meta-data detection circuit 324 is activated, using the first byte (or first two bytes) to generate the M-code using M-code generator 326. The M-code is then stored in the DRAM buffer in a page of M-code entries. Controller sequencer 328 causes the full data sector to be discarded and no entry for it stored in flash or DRAM.

Figure 15:
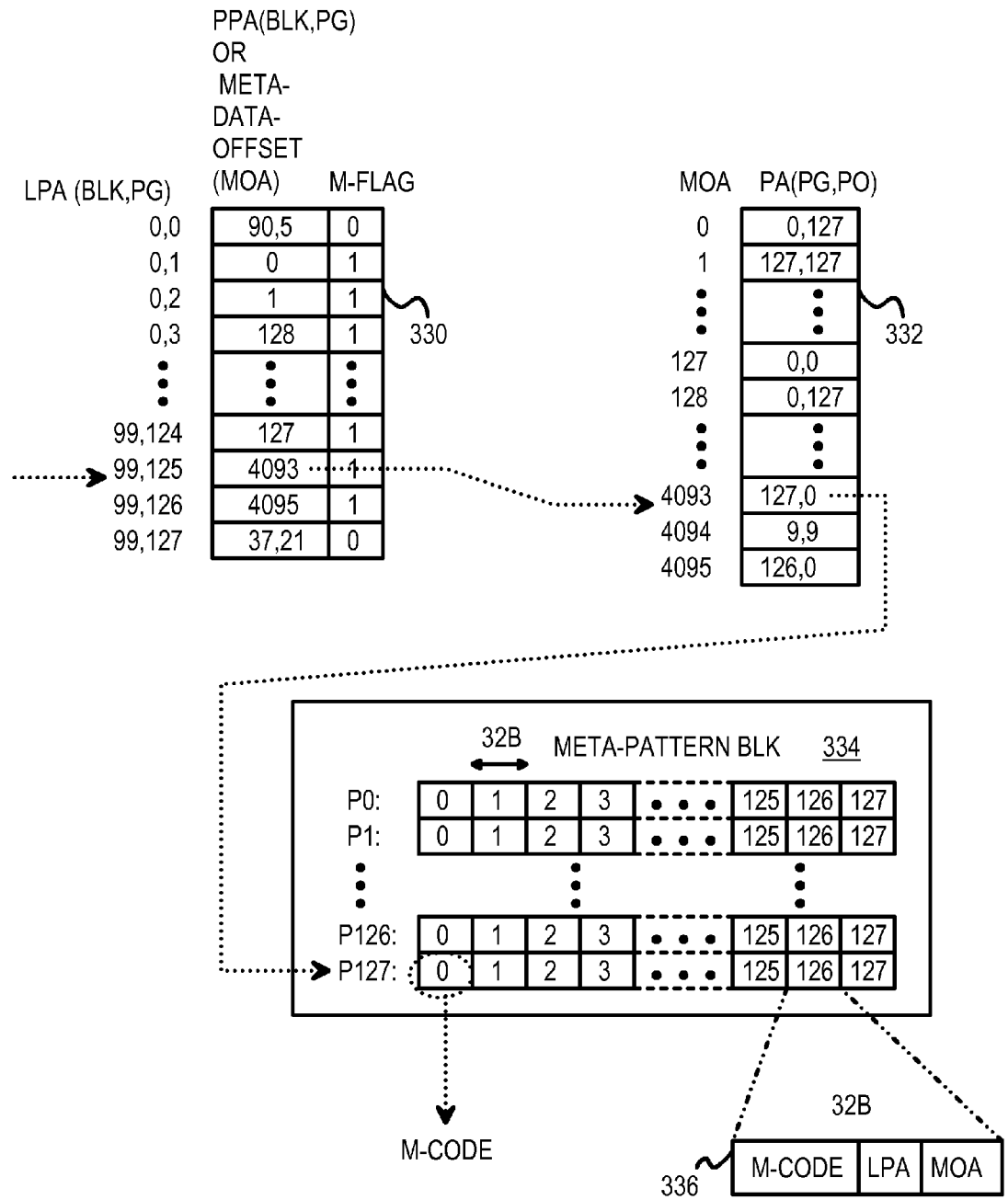
FIG. 15 shows a simplified meta-data packing scheme.

FIG. 15 shows a simplified meta-data packing scheme. Lookup table 330 is indexed by the logical page address (LPA), which includes the LBA and the page offset within the block. Normal entries that do not have pattern-matched sector data have the meta-data flash M-flag cleared, and the entries store the physical page address, which is the physical block address (PBA) and the page offset within the physical block. For example, LBA 99, page 127 is mapped to page 21 within physical block PBA 37.

When the M-flag is set for an entry in lookup table 330, that entry stores a Meta-Data Offset Address (MOA) rather than a physical PPA. The MOA is a pointer to an entry in meta-data mapping table 332.

Each entry in meta-data mapping table 332 contains a physical page and an offset within that page where the meta-data code is stored. All entries in meta-data mapping table 332 implicitly point to meta-pattern block 334, which is a special physical block in flash memory. Meta-pattern block 334 contains 128 pages in this example, and each page is 4K bytes.

Each page is divided into 128 entries of 32 bytes per entry in this example. Each meta-pattern entry 336 represents one data sector by an M-code. The LPA and the MOA for meta-pattern entry 336 are also stored with its M-Code so that meta-data mapping table 332 and lookup table 330 can be restored at power up initialization after a normal power off or unexpected power failure.

For example, LBA 99 and page 125 select an entry in lookup table 330 that has its M-flag set, and the entry has a MOA of 4093 that points to entry 4093 in meta-data mapping table 332. All entries in meta-data mapping table 332 point to meta-pattern block 334, which is a physical block in flash memory. Selected entry 4093 of meta-data mapping table 332 points to page 127, entry 0. The M-code for this data sector can be read out of the first meta-pattern entry 336 of page 127 in meta-pattern block 334, or a new M-code can be written in.

Figure 16:
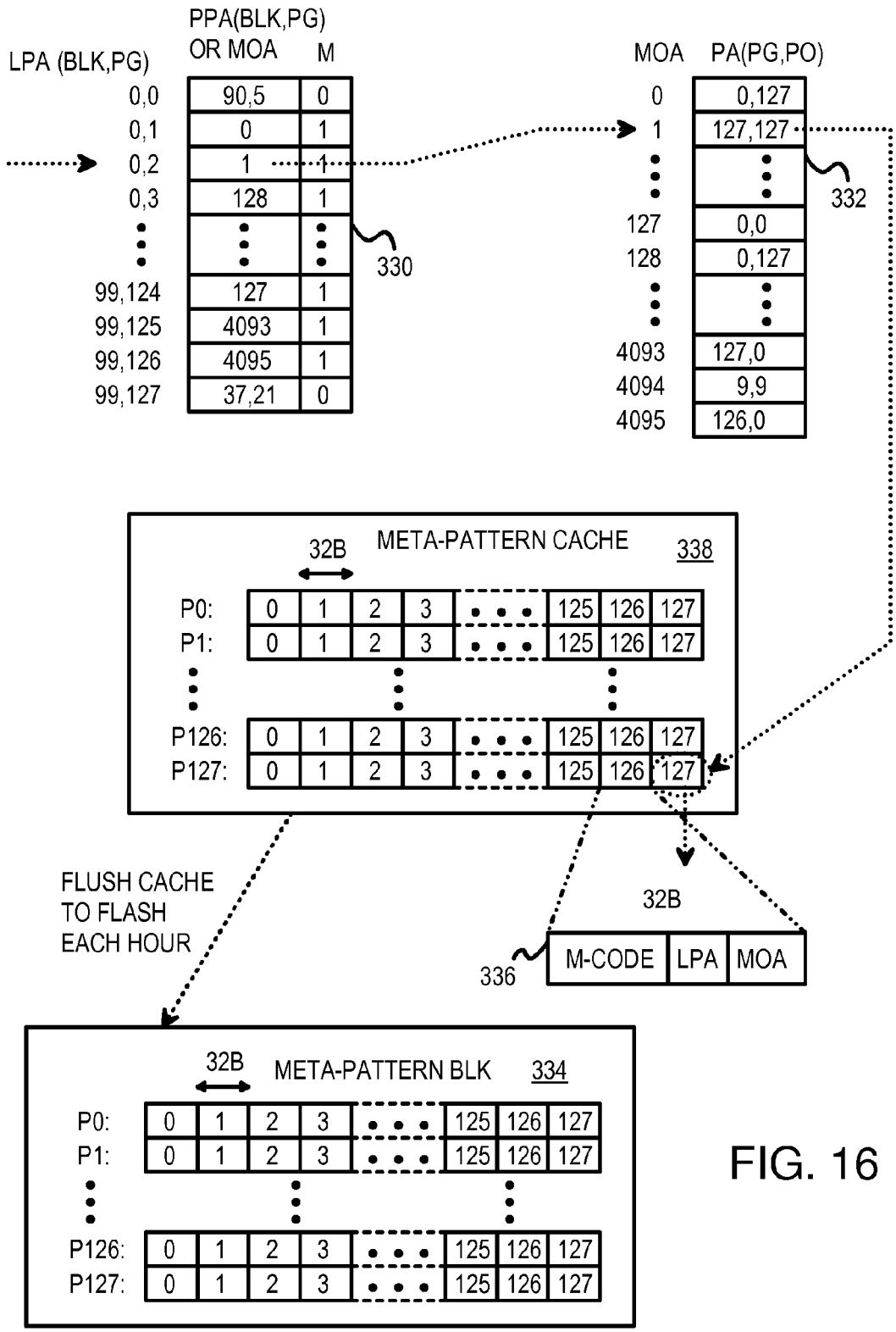
FIG. 16 shows a cached meta-pattern scheme for reduced write acceleration.

FIG. 16 shows a cached meta-pattern scheme for reduced write acceleration. The meta-pattern scheme of FIG. 15 is useful in compressing sector data into smaller meta-pattern entries. However, since meta-pattern block 334 is stored in flash, accesses to flash are not reduced. The inventors have realized that meta-pattern block 334 can be cached in DRAM 190 of FIG. 4A.

In this variation, meta-pattern block 334 is still kept in flash memory, but a cache of meta-pattern block 334 is kept in DRAM 190. Although all pages of meta-pattern block 334 are shown as cached by meta-pattern cache 338, only a subset of the pages may be cached in a real system.

The MOA in meta-data mapping table 332 still points to meta-pattern entry 336 in meta-pattern block 334. However, logic in smart storage switch 130 intercepts the access and directs it to meta-pattern cache 338. As the host writes sectors with matched patterns, the M-code generated in FIG. 14 is stored in meta-pattern entries 336 in meta-pattern cache 338. Once a whole page in meta-pattern cache 338 is loaded with meta-pattern entries 336, then that page can be copied to meta-pattern block 334 in flash memory. Since each page in meta-pattern block 334 can store 128 meta entries, a flash write can be delayed for up to 128 data sectors.

The sector data is not otherwise stored in flash memory for pattern-matched sectors. Thus a data sector is compressed to a 32-byte meta-pattern entry 336. The flash memory does not have to be written until a full page of 128 meta-pattern entries 336 is available in meta-pattern cache 338. Thus the number of writes can be reduced by a factor of 128.

Meta-pattern cache 338 can be flushed to meta-pattern block 334 periodically, such as once per hour or once per day. This periodic backup can prevent data loss.

Caching CRC's—FIGS. 17-18

Figures 17A, 17B:
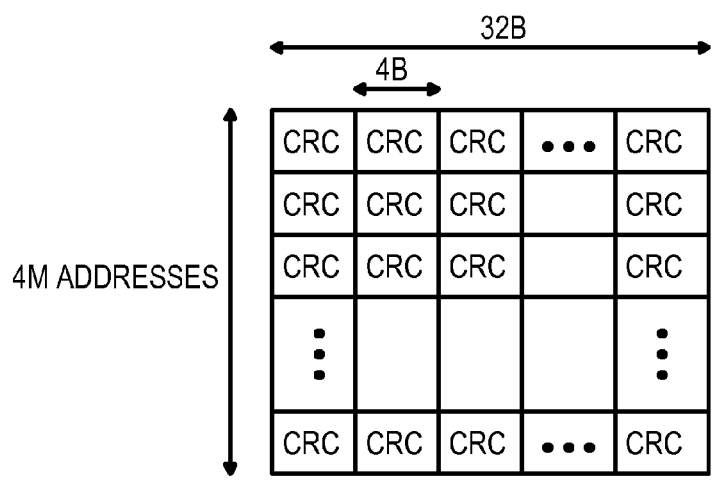
FIGS. 17A-B show CRC's for data sectors cached in DRAM.

FIGS. 17A-B show CRC's for data sectors cached in DRAM. The CRC from the host can be stored in DRAM 190 of FIG. 4A. The stored CRC can be compared to a CRC for new data from the host to quickly determine if a data match may have occurred.

In FIG. 17A each 4 KB page has 8 data sectors. One CRC is received from the host for each 512-byte data sector, and these CRC's are stored along with the data sectors. Each CRC is 4 bytes, so a total of 32 bytes of CRC are stored for each 4 KB page. For a system with a DRAM that can cache 4K pages, there are 128 KB of CRC's stored. All of these 128 KB of CRC's is stored in DRAM 190 in this embodiment. When a page is copied to flash, the CRC's are discarded.

In FIG. 17B, all CRC's are stored in both DRAM and flash memory. The flash memory contains 4M pages, so the storage for CRC's is 128 MB for a 16 GB SSD with 4K bytes/page. This amount of storage (128 MB) is too large for DRAM 190, so the CRC's are stored in flash memory and may be cached in DRAM.

Figure 18A:
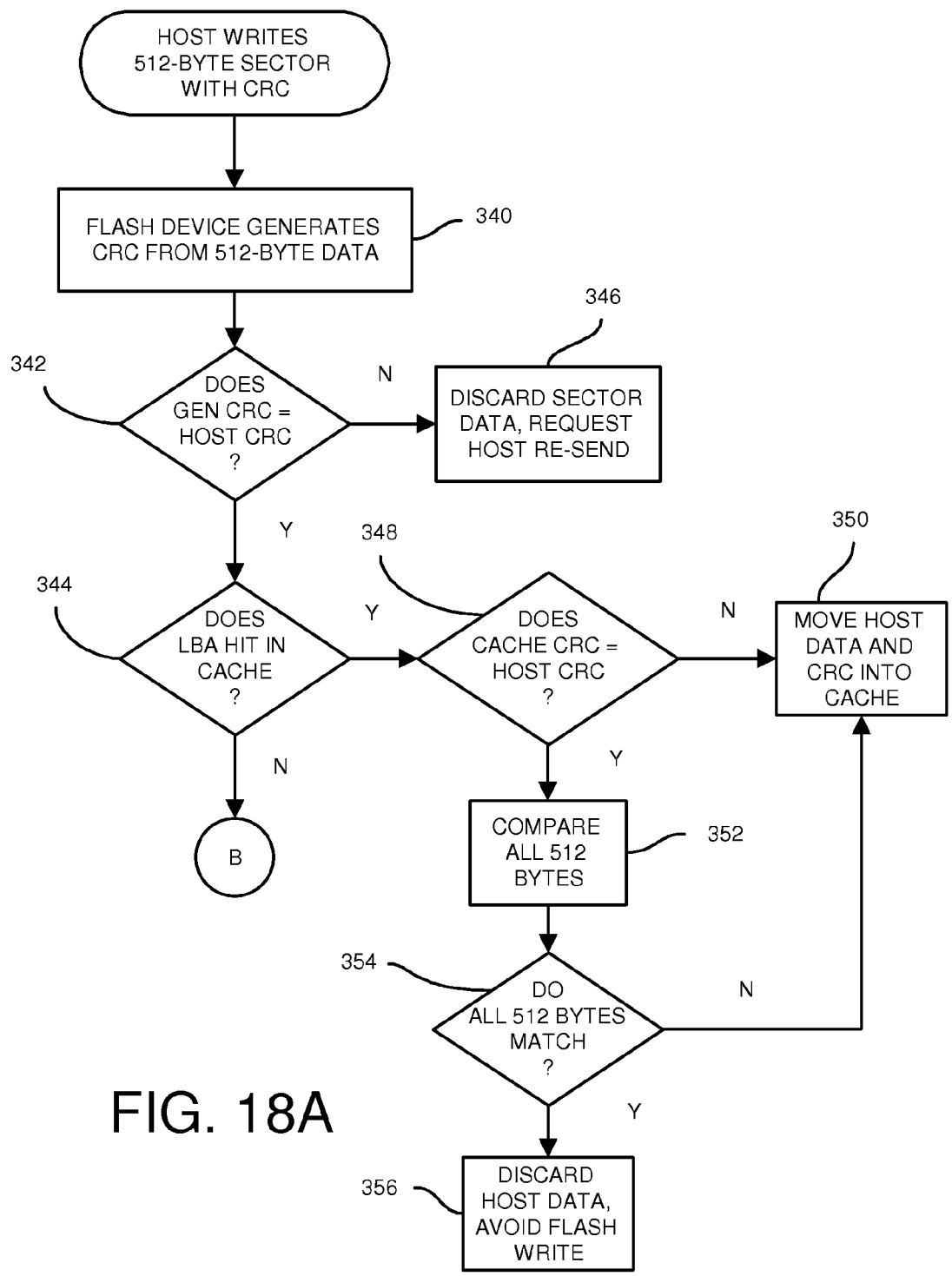
FIGS. 18A-B show a flowchart of avoiding flash writes by using stored CRC's.
Figure 18B:
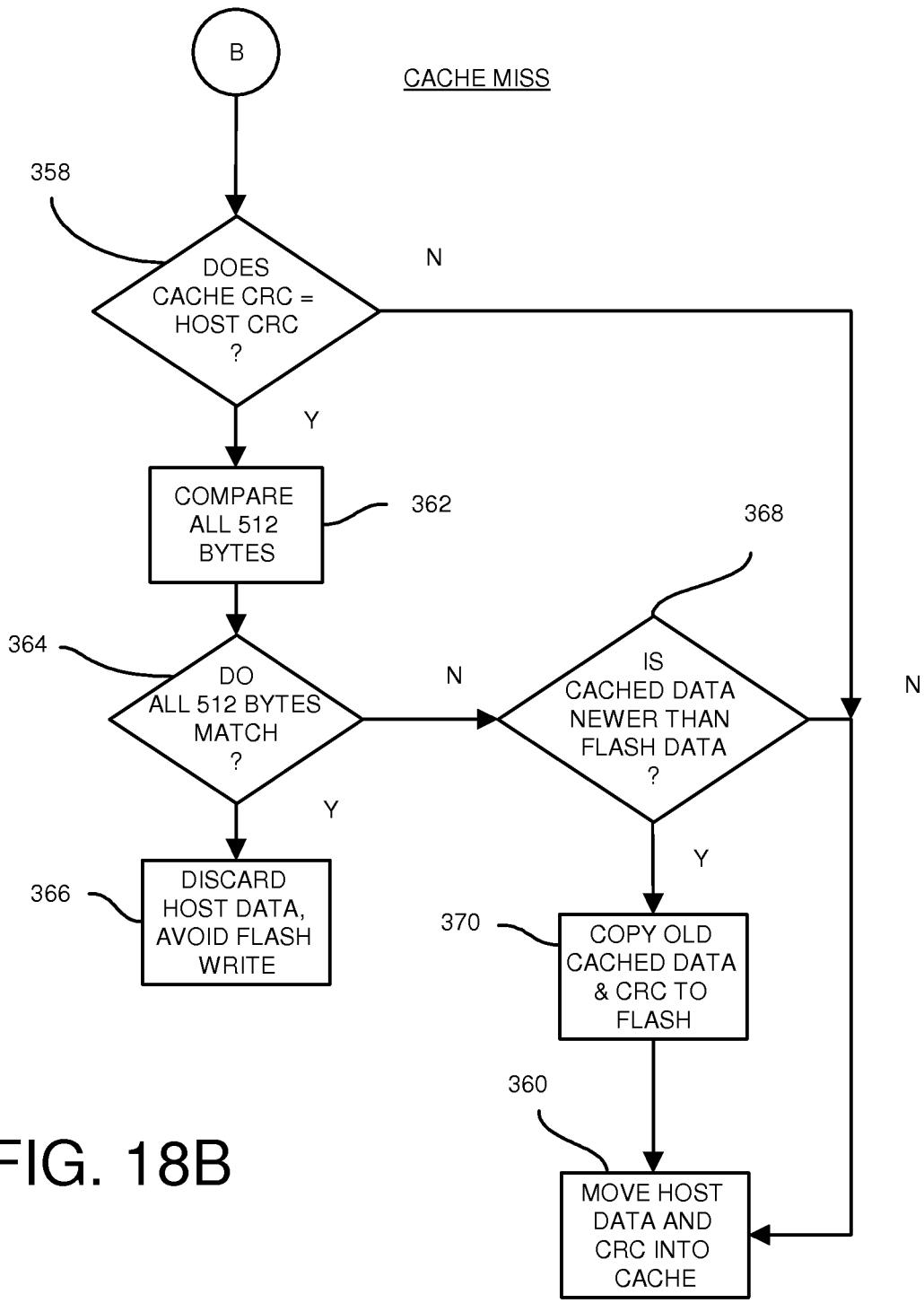

FIGS. 18A-B show a flowchart of avoiding flash writes by using stored CRC's. In FIG. 18A, when the host writes a 512-byte data sector to a flash device, the flash device generates a CRC from the 512-byte data sector received from the host, step 340. The flash device compares its generated CRC to the CRC received from the host, step 342. When the CRC's do not match, step 342, then the flash device requests that the host re-send the data, step 346, since a transmission error may have occurred.

When the host and generated CRC's match, step 342, the starting LBA is compared to LBA's in the DRAM cache, step 344. When a cache hit occurs, the CRC stored in the matching cache entry is compared to the host or newly generated CRC, step 348. When the CRC's differ, the host data is different that the cached data. The new data from the host is moved into the DRAM cache, step 350.

When the CRC's match, step 348, all bytes in the data sector are compared, step 352. The CRC's could match due to an alias, so all bytes are compared for verification. When some bytes do not match, step 354, the host data is different that the cached data. The new data from the host is moved into the DRAM cache, step 350.

When all bytes match, step 354, the host data can be safely discarded, step 356. An extra flash write has been avoided, since the data has already been accepted for writing into the flash. Write acceleration is reduced.

In FIG. 18B, when a cache miss occurs, the CRC stored in the matching cache entry is compared to the host or newly generated CRC, step 358. When the CRC's differ, the host data is different that the cached data. The new data from the host and its CRC are moved into the DRAM cache, step 360.

When the CRC's match, step 358, all bytes in the data sector are compared, step 362. The CRC's could match due to an alias, so all bytes are compared for verification. When all bytes match, step 364, the host data can be safely discarded, step 366. An extra flash write has been avoided, since the data has already been written into the flash. Write acceleration is reduced.

When some bytes do not match, step 364, the host data is different that the cached data. When the cached data is newer than the flash data, step 368, then the cached data is copied to flash, step 370. Then the new host data and CRC are moved into the DRAM cache, step 360.

When the cached data is older than the flash data, step 368, then the cached data can be discarded. The new host data and CRC are moved into the DRAM cache, step 360.

Initialization—FIGS. 19-22

Figure 19:
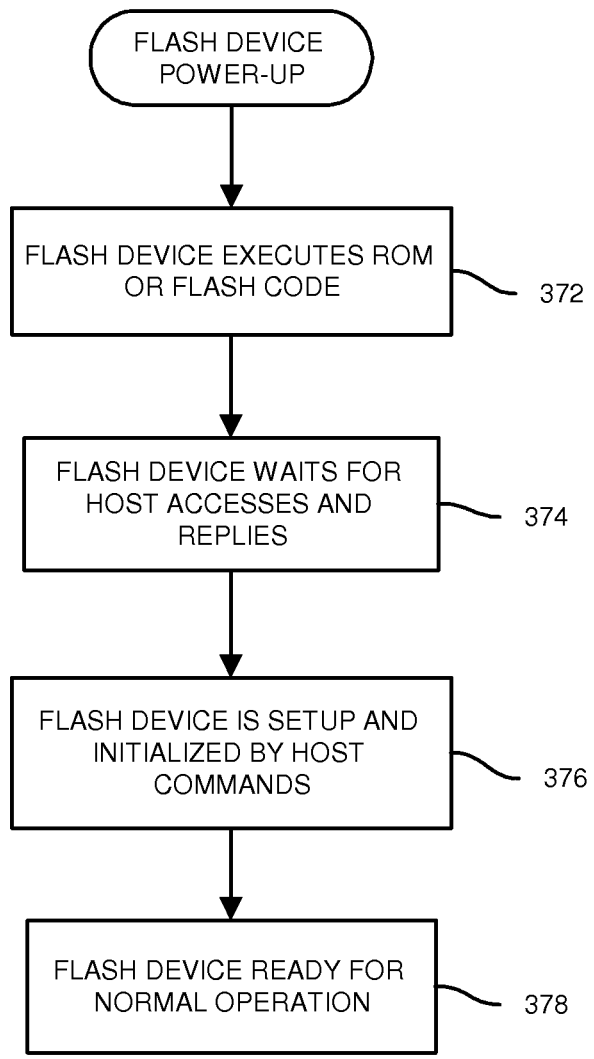
FIG. 19 is a flowchart of initialization of the flash modules.

FIG. 19 is a flowchart of initialization of the flash modules or a cluster of flash modules. On power-up, the flash device executes code from its ROM or from a starting code location in its flash memory, step 372. The flash device then waits for the host to access it, and the flash device responds to the host commands, step 374. The flash device is initialized and set up by the host through these commands, step 376. The flash device is now ready for normal operation, step 378.

Figure 20:
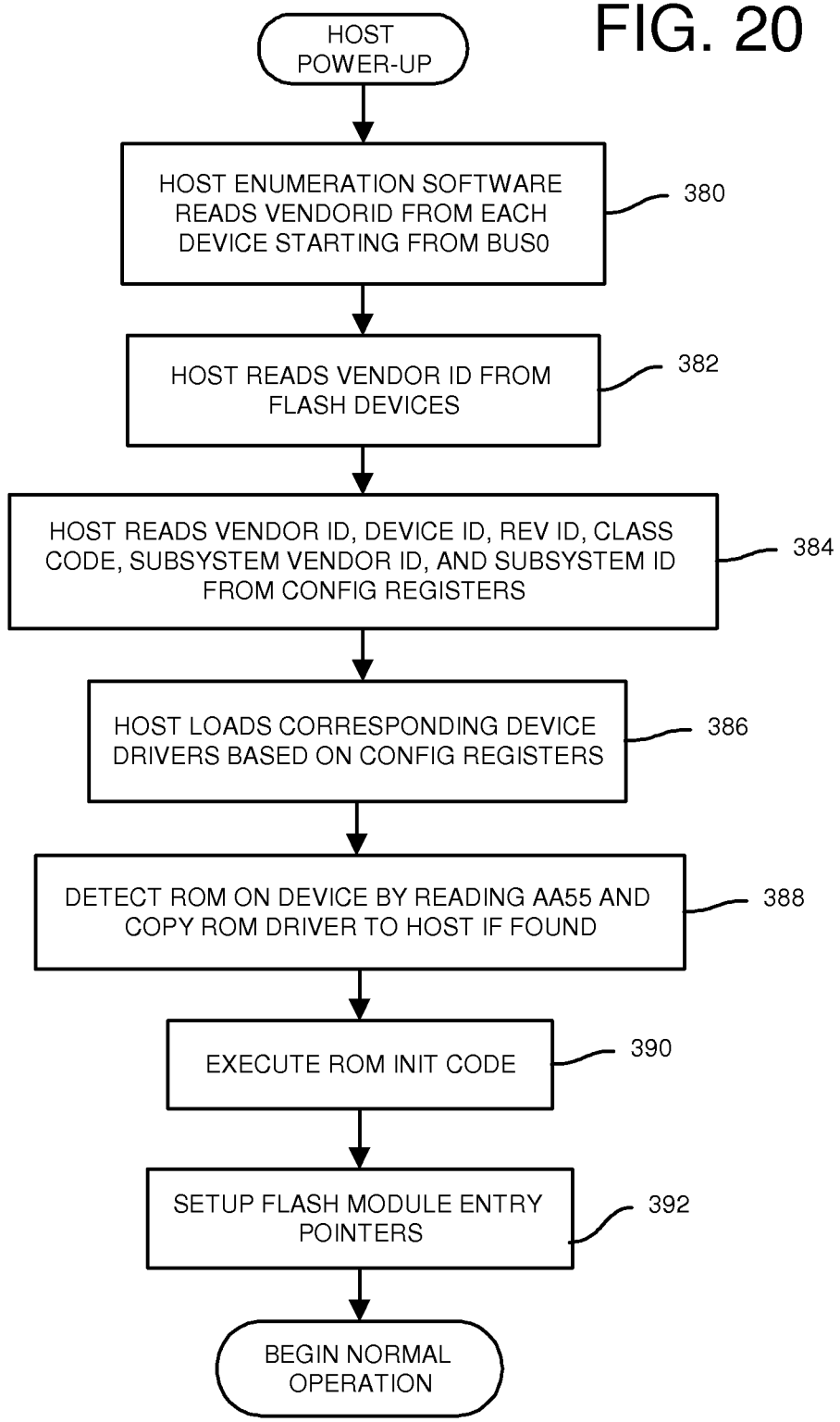
FIG. 20 is a flowchart of the host initializing the flash device.

FIG. 20 is a flowchart of the host initializing the flash device. On power up the host executes boot routines and eventually executes enumeration software that reads the vendor ID from configuration registers on each device on each bus, step 380. The host attempts to read a register from each bus, passing through all bus bridges such as PCIe bridges and I/O controllers. During this enumeration, the host reads the vendor ID's of all flash devices, step 382. The host then reads the configuration registers of the flash device, step 384, which include the vendor ID, device ID, class code, subsystem vendor ID, subsystem ID. The flowchart of FIG. 20 can be part of the SSD boot sequence, which in particular describes enumeration and recognition processes.

Based on the information read from the configuration registers on the flash device, the host loads a device driver for the flash device, step 386. The host detects the presence of a ROM on the flash device by reading the first 2 bytes of the device, step 388. If the signature AA55 is read, a driver on the flash device was found, and it is copied to the host. The host then executes the driver code, including any ROM code read from the flash device, step 390. Entry pointers to the flash device are setup, step 392. The flash device can then begin normal operation.

Figure 21:
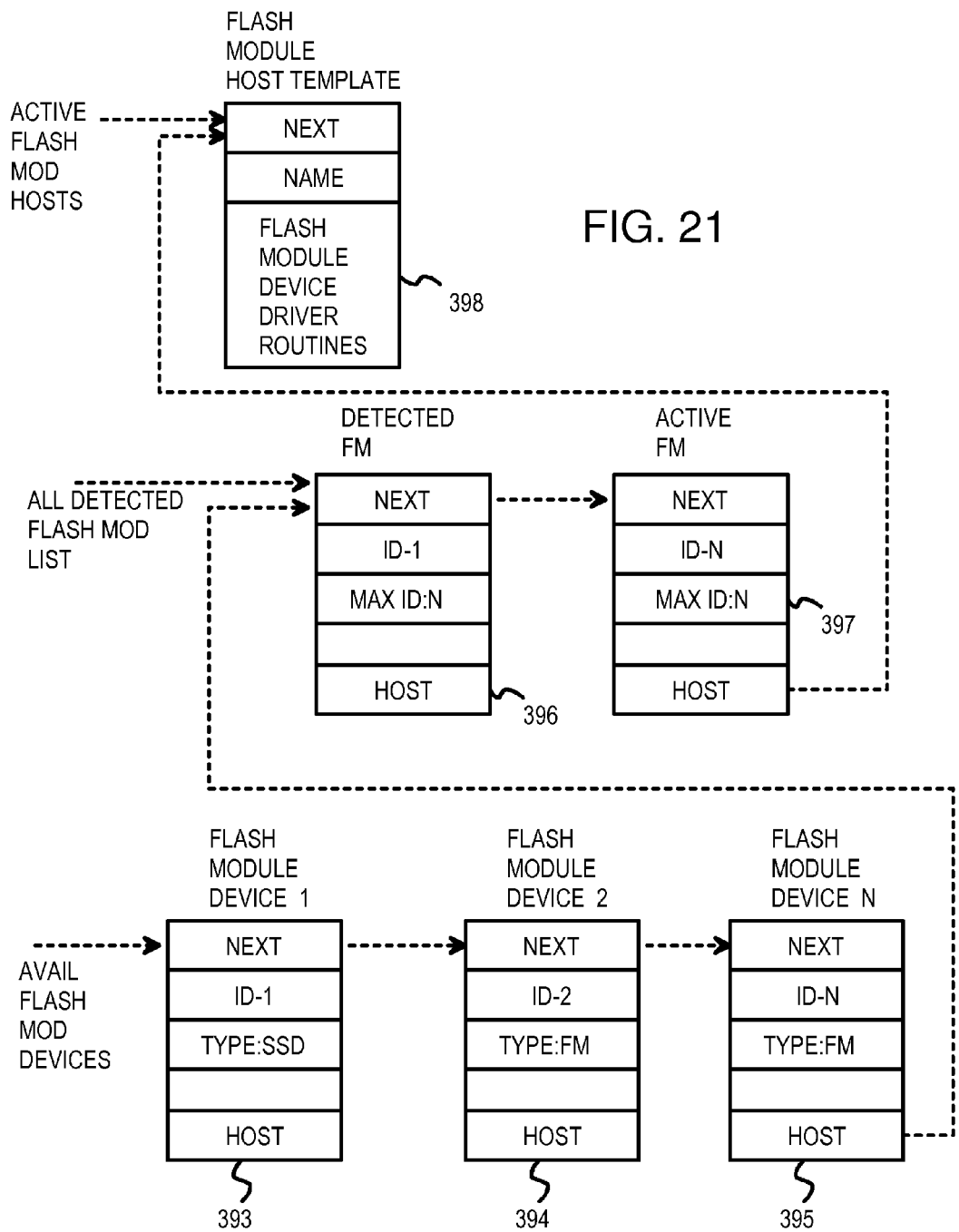
FIG. 21 shows flash module structures located during initialization.

FIG. 21 shows flash module structures located during initialization. The host reads configuration registers 393, 394, 395 to find the type of device, such as SSD and flash module FM. The configuration registers are linked together by the NEXT register pointer.

The host enumeration software generates a list of all detected flash modules which have pointers to flash modules 396, 397. The host field is a pointer to flash module host template 398 which can be a configuration register. The flash device drivers are located by flash module host template 398.

Figure 22:
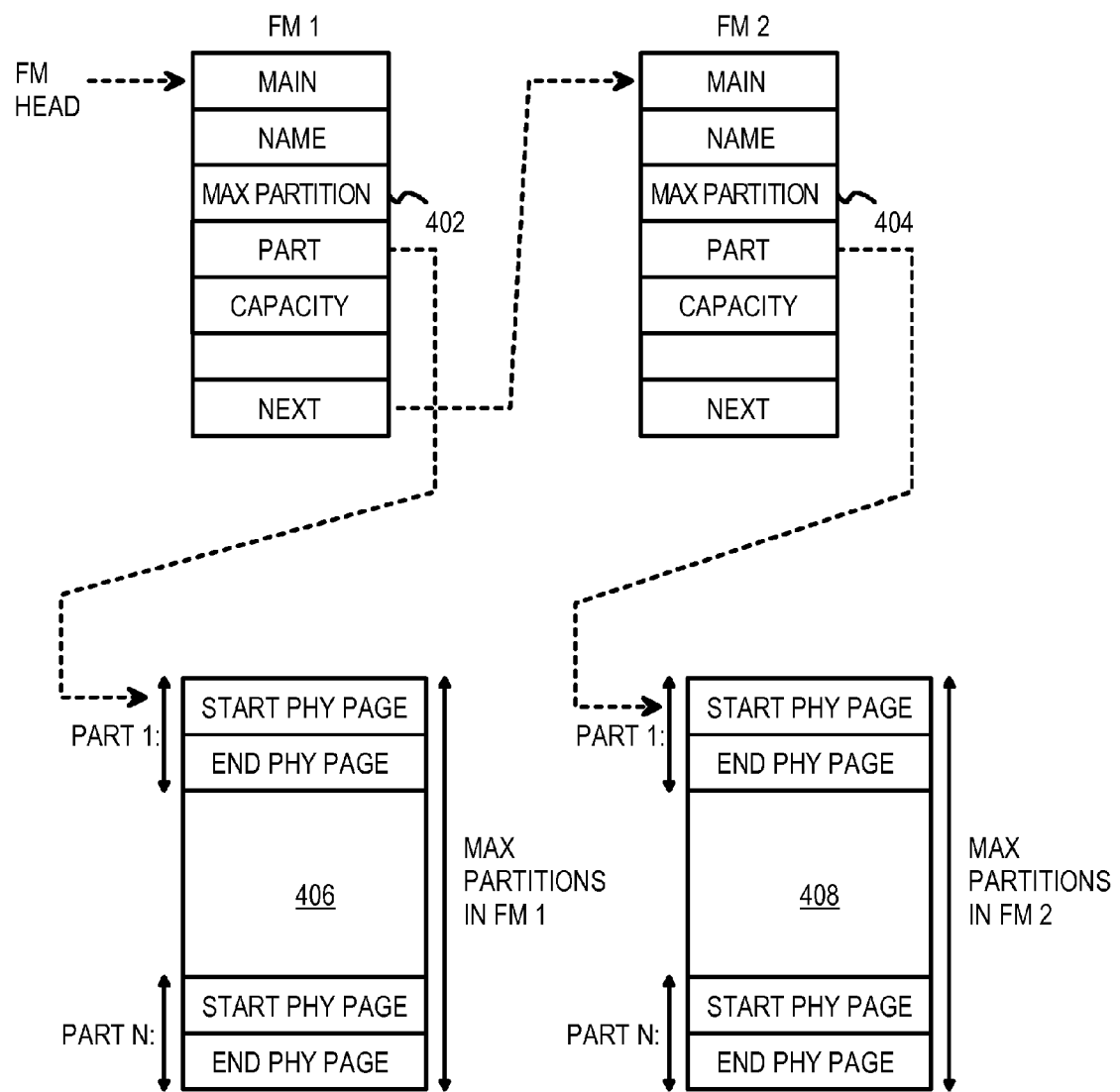
FIG. 22 shows a linked list of flash modules.

FIG. 22 shows a linked list of flash modules. Lists 402, 404 each contain a name, partition, capacity or size, and next fields. Lists 402, 404 are located in smart storage switch 130. The partition field points to the beginning of a current partition in each flash module. For example, flash module 406 has N partitions, where N is the maximum number of partitions that is stored in list 402. Each partition has a start and an end physical page. Flash module 408 can have a different number of physical partitions.

Alternate Embodiments

Several other embodiments are contemplated by the inventors. For example different page sizes and numbers of sectors in pages could be substituted, such as 8 sectors per page, and different numbers of pages per block may be used, such as 64, 128, or 512 pages per block. Many other size arrangements are possible.

Write acceleration is reduced by reducing the number of writes to flash memory. Skipping writes of identical data to flash, and packing meta-data codes into pages before writing can both reduce flash writes. Sub-dividing and merging host writes and waiting for a host read can also reduce flash writes. Many various combinations and modifications may be substituted.

For example, NVMD 412 can be one of the following: a block mode mapper with hybrid SLC/MLC flash memory, a block mode mapper with SLC or MLC, a page mode mapper with hybrid MLC/SLC flash memory, a page mode mapper with SLC or MLC. Alternatively, NVMD 412 in flash module 110 can include raw flash memory chips. NVMD 412 and smart storage switch 30 in a flash module can include raw flash memory chips and a flash controller as shown in FIGS. 3A-C of the parent application U.S. Ser. No. 12/252,155.

Each block may be divided into multi-page zones. For example, a block may have 16 pages and 4 zones, with 4 pages per zone. Some of the mapping may be for zones rather than for individual pages in this alternative embodiment. Alternatively, in a special case, there can be one page per zone. Fewer mapping entries are needed with zone-mode than for page-mode, since each zone is multiple pages.

The upper bits of the logical-sector address (LSA) from the host may select a cluster or district. All of the entries in a mapping table may be for the same district. When the district number from the LSA matches the district number of all the entries in the mapping table, the LBA from the LSA selects an entry in the mapping table. Hybrid mapping tables may also be used.

Copying of blocks for relocation is less frequent with page mapping since the sequential-writing rules of the MLC flash are violated less often in page mode than in block mode. This increases the endurance of the flash system and increases performance.

The mapping tables may be located in an extended address space, and may use virtual addresses or illegal addresses that are greater than the largest address in a user address space. Pages may remain in the host's page order or may be remapped to any page location. Other encodings are possible.

Many variations of FIG. 1A-B and others are possible. A ROM such as an EEPROM could be connected to or part of virtual storage processor 140, or another virtual storage bridge 42 and NVM controller 76 could connect virtual storage processor 140 to another raw-NAND flash memory chip or to NVM flash memory 68 that is dedicated to storing firmware for virtual storage processor 140. This firmware could also be stored in the main flash modules. Host storage bus 18 can be a Serial AT-Attachment (SATA) bus, a Peripheral Components Interconnect Express (PCIe) bus, a compact flash (CF) bus, or a Universal-Serial-Bus (USB), a Firewire 1394 bus, a Fibre Channel (FC) bus, etc. LBA storage bus interface 28 can be a Serial AT-Attachment (SATA) bus, an integrated device electronics (IDE) bus, a Peripheral Components Interconnect Express (PCIe) bus, a compact flash (CF) bus, a Universal-Serial-Bus (USB), a Secure Digital (SD) bus, a Multi-Media Card (MMC) bus, a Firewire 1394 bus, a Fibre Channel (FC) bus, various Ethernet buses, etc. NVM memory 68 can be SLC or MLC flash only or can be combined SLC/MLC flash. Mapper 46 in NVM controller 76 can perform one level of block mapping to a portion of SLC or MLC flash memory, and two levels of page mapping may be performed for the remaining SLC or MLC flash memory.

The flash memory may be embedded on a motherboard or SSD board or could be on separate modules. Capacitors, buffers, resistors, and other components may be added. Smart storage switch 130 may be integrated on the motherboard or on a separate board or module. NVM controller 76 can be integrated with smart storage switch 130 or with raw-NAND flash memory chips as a single-chip device or a plug-in module or board. SDRAM can be directly soldered to a card or other boards or a removable SDRAM module may be plugged into a module socket.

Using multiple levels of controllers, such as in a president-governor arrangement of controllers, the controllers in smart storage switch 30 may be less complex than would be required for a single level of control for wear-leveling, bad-block management, re-mapping, caching, power management, etc. Since lower-level functions are performed among flash memory chips 68 within each flash module by NVM controllers 76 as a governor function, the president function in smart storage switch 30 can be simplified. Less expensive hardware may be used in smart storage switch 30, such as using an 8051 processor for virtual storage processor 140 or smart storage transaction manager 36, rather than a more expensive processor core such as a an Advanced RISC Machine ARM-9 CPU core.

Different numbers and arrangements of flash storage blocks can connect to the smart storage switch. Rather than use LBA storage bus interface 28 or differential serial packet buses, other serial buses such as synchronous Double-Data-Rate (DDR), ONFI, Toggle NAND, a differential serial packet data bus, a legacy flash interface, etc.

Mode logic could sense the state of a pin only at power-on rather than sense the state of a dedicated pin. A certain combination or sequence of states of pins could be used to initiate a mode change, or an internal register such as a configuration register could set the mode. A multi-bus-protocol chip could have an additional personality pin to select which serial-bus interface to use, or could have programmable registers that set the mode to hub or switch mode.

The transaction manager and its controllers and functions can be implemented in a variety of ways. Functions can be programmed and executed by a CPU or other processor, or can be implemented in dedicated hardware, firmware, or in some combination. Many partitionings of the functions can be substituted. Smart storage switch 30 may be hardware, or may include firmware or software or combinations thereof.

Overall system reliability is greatly improved by employing Parity/ECC with multiple NVM controllers 76, and distributing data segments into a plurality of NVM blocks. However, it may require the usage of a CPU engine with a DDR/SDRAM cache in order to meet the computing power requirement of the complex ECC/Parity calculation and generation. Another benefit is that, even if one flash block or flash module is damaged, data may be recoverable, or the smart storage switch can initiate a "Fault Recovery" or "Auto-Rebuild" process to insert a new flash module, and to recover or to rebuild the "Lost" or "Damaged" data. The overall system fault tolerance is significantly improved.

Wider or narrower data buses and flash-memory chips could be substituted, such as with 16 or 32-bit data channels. Alternate bus architectures with nested or segmented buses could be used internal or external to the smart storage switch. Two or more internal buses can be used in the smart storage switch to increase throughput. More complex switch fabrics can be substituted for the internal or external bus.

Data striping can be done in a variety of ways, as can parity and error-correction code (ECC). Packet re-ordering can be adjusted depending on the data arrangement used to prevent re-ordering for overlapping memory locations. The smart switch can be integrated with other components or can be a stand-alone chip.

Additional pipeline or temporary buffers and FIFO's could be added. For example, a host FIFO in smart storage switch 30 may be may be part of smart storage transaction manager 36, or may be stored in SDRAM 60. Separate page buffers could be provided in each channel. A clock source could be added.

A single package, a single chip, or a multi-chip package may contain one or more of the plurality of channels of flash memory and/or the smart storage switch.

A MLC-based flash module may have four MLC flash chips with two parallel data channels, but different combinations may be used to form other flash modules, for example, four, eight or more data channels, or eight, sixteen or more MLC chips. The flash modules and channels may be in chains, branches, or arrays. For example, a branch of 4 flash modules could connect as a chain to smart storage switch 30. Other size aggregation or partition schemes may be used for different access of the memory. Flash memory, a phase-change memory (PCM), or ferroelectric random-access memory (FRAM), Magnetoresistive RAM (MRAM), Memristor, PRAM, SONOS, Resistive RAM (RRAM), Racetrack memory, and nano RAM (NRAM) may be used.

The host can be a PC motherboard or other PC platform, a mobile communication device, a personal digital assistant (PDA), a digital camera, a combination device, or other device. The host bus or host-device interface can be SATA, PCIE, SD, USB, or other host bus, while the internal bus to a flash module can be PATA, multi-channel SSD using multiple SD/MMC, compact flash (CF), USB, or other interfaces in parallel. A flash module could be a standard PCB or may be a multi-chip modules packaged in a TSOP, BGA, LGA, COB, PIP, SIP, CSP, POP, or Multi-Chip-Package (MCP) packages and may include raw-NAND flash memory chips or raw-NAND flash memory chips may be in separate flash chips, or other kinds of NVM flash memory 68. The internal bus may be fully or partially shared or may be separate buses. The SSD system may use a circuit board with other components such as LED indicators, capacitors, resistors, etc.

While a first-in-first-out (FIFO) has been described, the FIFO can merge and invalidate entries and may be able to reorder entries. While lookup and other tables and buffers have been described as residing in DRAM, they could reside in other memories such as on-chip RAM's on smart storage switch 130. While SDRAM and DRAM have been described, a static random-access memory (SRAM) could be used alone or in combination with DRAM or SDRAM. Many combinations are possible, and the volatile memory may have several blocks or components in separate locations.

Directional terms such as upper, lower, up, down, top, bottom, etc. are relative and changeable as the system or data is rotated, flipped over, etc. These terms are useful for describing the device but are not intended to be absolutes.

NVM flash memory 68 may be on a flash module that may have a packaged controller and flash die in a single chip package that can be integrated either onto a PCBA, or directly onto the motherboard to further simplify the assembly, lower the manufacturing cost and reduce the overall thickness. Flash chips could also be used with other embodiments including the open frame cards.

Rather than use smart storage switch 130 only for flash-memory storage, additional features may be added. For example, a music player may include a controller for playing audio from MP3 data stored in the flash memory. An audio jack may be added to the device to allow a user to plug in headphones to listen to the music. A wireless transmitter such as a BlueTooth transmitter may be added to the device to connect to wireless headphones rather than using the audio jack. Infrared transmitters such as for IrDA may also be added. A BlueTooth transceiver to a wireless mouse, PDA, keyboard, printer, digital camera, MP3 player, or other wireless device may also be added. The BlueTooth transceiver could replace the connector as the primary connector. A Bluetooth adapter device could have a connector, a RF (Radio Frequency) transceiver, a baseband controller, an antenna, a flash memory (EEPROM), a voltage regulator, a crystal, a LED (Light Emitted Diode), resistors, capacitors and inductors. These components may be mounted on the PCB before being enclosed into a plastic or metallic enclosure.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A smart-storage switch solid-state-drive (SSD) comprising:
   a Non-Volatile Memory (NVM) that retains data when power is lost;
   a volatile memory that loses data when power is lost;
   a smart storage switch which comprises:
      a protocol converter, coupled to a host, for receiving host commands to access the NVM and for receiving host data and a host logical block address (LBA);
      a LBA range first-in-first-out (FIFO) having entries for storing the host LBA and a length of the host data;
      a volatile memory controller for interfacing to the volatile memory;
      a flash controller for interfacing to the NVM;
      a processor for controlling transfer of host data among the protocol converter, the LBA range FIFO, the volatile memory controller, and the flash controller;
   a sector data buffer, in the volatile memory, for storing the host data before writing to the NVM; and
   a lookup table, in the volatile memory, that maps pages in the host LBA to physical pages in a physical-block address (PBA) in the NVM;
   wherein the lookup table is page-mapped;
   wherein the processor operates to reduce writes to the NVM to reduce write acceleration;
   wherein the LBA range FIFO comprises sub-divided entries that are generated by the processor when a new host command has new host data that overlaps host data for a prior entry in the LBA range FIFO, the processor dividing the prior entry into a plurality of sub-divided entries in the LBA range FIFO;
   wherein sub-divided entries that are completely overlapped by new host data are invalidated and not written to the NVM;
   whereby writes to the NVM are reduced by invalidating overlapping sub-divided entries in the LBA range FIFO.

2. The smart-storage switch solid-state-drive of claim 1 wherein the processor delays writing the host data for entries in the LBA range FIFO into the NVM until a host read is received by the protocol converter,
   whereby host writes to NVM are delayed until the host read is received.

3. The smart-storage switch solid-state-drive of claim 2 wherein the processor pre-fetches data from the NVM and loads the pre-fetched data before a start of the host data when the start of the host data is not aligned to a boundary;
   wherein the processor post-fetches data from the NVM and loads the post-fetched data after an end of the host data when the end of the host data is not aligned to a boundary,
   whereby host data is aligned to boundaries by pre-fetching and post-fetching.

4. The smart-storage switch solid-state-drive of claim 3 wherein the boundary is a page boundary.

5. A smart-storage switch solid-state-drive (SSD) comprising:
   a Non-Volatile Memory (NVM) that retains data when power is lost;
   a volatile memory that loses data when power is lost;
   a smart storage switch which comprises:
      a protocol converter, coupled to a host, for receiving host commands to access the NVM and for receiving host data and a host logical block address (LBA);
      a LBA range first-in-first-out (FIFO) having entries for storing the host LBA and a length of the host data;
      a volatile memory controller for interfacing to the volatile memory;
      a flash controller for interfacing to the NVM;
      a processor for controlling transfer of host data among the protocol converter, the LBA range FIFO, the volatile memory controller, and the flash controller;
   a sector data buffer, in the volatile memory, for storing the host data before writing to the NVM; and a lookup table, in the volatile memory, that maps pages in the host LBA to physical pages in a physical-block address (PBA) in the NVM;

wherein the lookup table is page-mapped;

wherein the processor operates to reduce writes to the NVM to reduce write acceleration;

wherein the protocol converter further receives a host cyclical-redundancy-check (CRC) from the host;

further comprising:

a CRC generator that receives the host data from the protocol converter and generates a generated CRC from the host data;

wherein the protocol converter discards the host data when the host CRC mismatches the generated CRC;

wherein the host CRC or the generated CRC is stored in the volatile memory as a stored CRC;

wherein when the host LBA matches a cached LBA for a matching entry in the volatile memory, the stored CRC is read from the volatile memory and compared to the host CRC or generated CRC to signal a CRC match;

when the CRC match is signaled, comparing all bytes in the host data to stored bytes for the matching entry in the volatile memory and signaling a data match when all byte match;

when the data match is signaled, discarding the host data and not writing the host data to the volatile memory, whereby writing duplicate host data to the NVM is avoided by comparison of the stored CRC.

6. The smart-storage switch solid-state-drive of claim 5 wherein the protocol converter is coupled to the host through a Serial AT-Attachment (SATA) bus, a Serial small-computer system interface (SCSI) (SAS) bus, a fiber-channel (FC) bus, an InfiniBand bus, an integrated device electronics (IDE) bus, a Peripheral Components Interconnect Express (PCIe) bus, a compact flash (CF) bus, a Universal-Serial-Bus (USB), a Secure Digital Bus (SD), a MultiMediaCard (MMC), or a LBA bus protocol which transfers read and write commands, a starting page address with a sector offset, and a sector count.

7. The smart-storage switch solid-state-drive of claim 5 wherein the NVM comprises a plurality of flash modules each comprising a plurality of flash memory devices.

8. A smart-storage switch solid-state-drive (SSD) comprising:

a Non-Volatile Memory (NVM) that retains data when power is lost;

a volatile memory that loses data when power is lost;

a smart storage switch which comprises:

a protocol converter, coupled to a host, for receiving host commands to access the NVM and for receiving host data and a host logical block address (LBA);

a LBA range first-in-first-out (FIFO) having entries for storing the host LBA and a length of the host data;

a volatile memory controller for interfacing to the volatile memory;

a flash controller for interfacing to the NVM;

a processor for controlling transfer of host data among the protocol converter, the LBA range FIFO, the volatile memory controller, and the flash controller;

a sector data buffer, in the volatile memory, for storing the host data before writing to the NVM; and a lookup table, in the volatile memory, that maps pages in the host LBA to physical pages in a physical-block address (PBA) in the NVM;

wherein the lookup table is page-mapped;

wherein the processor operates to reduce writes to the NVM to reduce write acceleration;

a pattern detector for comparing an initial byte of the host data to subsequent bytes of the host data and signaling a pattern match when the initial byte is repeated for the subsequent bytes;

a meta-data code generator for generating a meta-data code from the initial byte when the pattern detector signals the pattern match; and a meta-data mapping table storing meta-pointer entries;

wherein the processor loads an entry in the lookup table with a pointer to a meta-pointer entry in the meta-data mapping table when the pattern match is signaled;

wherein the meta-pointer entry identifies a meta entry in a meta-pattern block, the meta entry containing the meta-data code generated by the meta-data code generator.

9. The smart-storage switch solid-state-drive of claim 8 wherein the host data is not stored to the NVM when the pattern match is signaled, wherein the meta-data code is written to the NVM.

10. The smart-storage switch solid-state-drive of claim 9 wherein the meta-data codes are packed into a meta page that stores a plurality of meta-data codes, wherein writes to the NVM are reduced for pattern-matched host data.

11. The smart-storage switch solid-state-drive of claim 10 wherein the host data is a sector of 512 bytes;

wherein the meta-data code is 32 bytes or less in size.

12. The smart-storage switch solid-state-drive of claim 10 further comprising:

a meta-pattern cache that caches pages of the meta-pattern block;

wherein a plurality of the meta entries are loaded into a meta page in the meta-pattern cache before the meta page is written to the NVM, wherein writes to the NVM are reduced by loading the meta page with a plurality of the meta entries each representing pattern-matched host data before the meta page is written to the NVM.

13. The smart-storage switch solid-state-drive of claim 12 wherein the meta-pattern cache is stored in the volatile memory.

14. The smart-storage switch solid-state-drive of claim 12 wherein the meta entry in the meta-pattern block further comprises the pointer to a meta-pointer entry in the meta-data mapping table and the host LBA.

15. The smart-storage switch solid-state-drive of claim 12 wherein the meta-pattern cache is periodically flushed to the meta-pattern block in the NVM.

16. The smart-storage switch solid-state-drive of claim 12 wherein the processor sets a meta flag in the lookup table when the pattern detector signals the pattern match, and loads the pointer to the meta-pointer entry in the meta-data mapping table;

wherein the processor clears the meta flag in the lookup table when the pattern match is not signaled, a loads an identifier to physical block and an identifier to a physical page into an entry in the lookup table, wherein the host data is stored at the physical page in the physical block, whereby entries in the lookup table store physical mappings and pointers to the meta-data mapping table.

17. A computer-implemented method for reducing writes to flash memory in a flash-memory system comprising:

receiving host data for a host write command and storing the host data in a sector data cache at a location identified by a buffer pointer;

receiving the host write command from a host and loading a starting logical block address (LBA), a length of the host transfer in sectors, and the buffer pointer into a current entry in a LBA range FIFO;

detecting a range overlap of the current entry with a prior entry in the LBA range FIFO;

sub-dividing the prior entry into sub-divided entries in the LBA range FIFO when the range overlap is detected by dividing the prior entry at the starting LBA and at an end that is the starting LBA plus the length of the current entry;

invalidating a sub-divided entry that is completely overlapped by the current entry in the LBA range FIFO;

delaying writing the host data from the sector data cache to a flash memory until after a host read command is received from the host;

wherein the host tread command triggers writing to the flash memory.

18. The computer-implemented method for reducing writes to flash memory of claim 17 further comprising page aligning by:

detecting when the starting LBA in the current entry is a multiple of a page size;

pre-fetching data sectors from the flash memory that are before the starting LBA until a boundary that is a multiple of the page size is reached;

storing the data sectors that are prefetched in the sector data cache for the current entry;

calculating an ending LBA by adding the starting LBA to the length for the current entry;

detecting when the ending LBA in the current entry is a multiple of the page size;

post-fetching data sectors from the flash memory that are after the ending LBA until a boundary that is a multiple of the page size is reached;

storing the data sectors that are post-fetched in the sector data cache for the current entry.

19. A solid-state-drive (SSD) comprising:

Non-Volatile Memory (NVM) means for storing data that is retained when power is lost;

volatile memory means for storing data that is lost when power is lost;

a smart storage switch which comprises:

protocol converter means, coupled to a host, for receiving host commands to access the NVM means and for receiving host data and a host logical block address (LBA);

a LBA range first-in-first-out (FIFO) having entries for storing the host LBA and a length of the host data;

volatile memory controller means for interfacing to the volatile memory means;

flash controller means for interfacing to the NVM means;

processor means for controlling transfer of host data among the protocol converter means, the LBA range FIFO, the volatile memory controller means, and the flash controller means;

sector data buffer means, in the volatile memory means, for storing the host data before writing to the NVM means; and lookup table means, in the volatile memory means, for mapping pages in the host LBA to physical pages in a physical-block address (PBA) in the NVM means;

wherein the lookup table means is page-mapped;

wherein the LBA range FIFO comprises sub-divided entries that are generated by the processor means when a new host command has new host data that overlaps host data for a prior entry in the LBA range FIFO, the processor means further for dividing the prior entry into a plurality of sub-divided entries in the LBA range FIFO;

wherein sub-divided entries that are completely overlapped by new host data are invalidated and not written to the NVM means;

wherein the processor means is further for delaying writing the host data for entries in the LBA range FIFO into the NVM means until a host read is received by the protocol converter means, wherein the processor means operates to reduce writes to the NVM means to reduce write acceleration.

20. The solid-state-drive of claim 19 wherein the processor means further comprises:

pre-fetch means for pre-fetching data from the NVM means and for loading the pre-fetched data before a start of the host data when the start of the host data is not aligned to a boundary;

post-fetching means for post-fetching data from the NVM means and for loading the post-fetched data after an end of the host data when the end of the host data is not aligned to a boundary, whereby host data is aligned to boundaries by pre-fetching and post-fetching.

21. The solid-state-drive of claim 19 wherein the protocol converter means further comprises:

vendor identifier means for reading a vendor identifier and a volume capacity and for sending the vendor identifier and the volume capacity to the host;

wherein a device driver in the host uses a Non-Volatile Memory Host Controller Interface (NVMHCI) interface to identify a register set based on the vendor identifier and the volume capacity;

wherein the device driver hierarchically configures registers based on the vendor identifier and the volume capacity read from the solid-state-drive.

* * * * *